(12) United States Patent
Tolstikhin

(10) Patent No.: US 7,095,938 B2
(45) Date of Patent: Aug. 22, 2006

(54) VERTICAL INTEGRATION OF ACTIVE DEVICES WITHIN PASSIVE SEMICONDUCTOR WAVEGUIDES

(75) Inventor: Valery I. Tolstikhin, Kanata (CA)

(73) Assignee: MetroPhotonics Inc., Ottawa (CA)

( * ) Notice: Subject to any disclaimer, the term of this patent is extended or adjusted under 35 U.S.C. 154(b) by 92 days.

(21) Appl. No.: 10/472,565

(22) PCT Filed: Feb. 18, 2002

(86) PCT No.: PCT/CA02/00194

§ 371 (c)(1),
(2), (4) Date: Sep. 25, 2003

(87) PCT Pub. No.: WO02/077682

PCT Pub. Date: Oct. 3, 2002

(65) Prior Publication Data

US 2004/0096175 A1    May 20, 2004

Related U.S. Application Data

(60) Provisional application No. 60/278,750, filed on Mar. 27, 2001.

(51) Int. Cl.
*G02B 6/10* (2006.01)
(52) U.S. Cl. .................. 385/131; 385/129; 385/130
(58) Field of Classification Search ............. 385/14, 385/27, 28, 29, 30, 129, 130, 131
See application file for complete search history.

(56) References Cited

U.S. PATENT DOCUMENTS 5,117,469 A * 5/1992 Cheung et al. ............... 385/11

(Continued)

FOREIGN PATENT DOCUMENTS

EP    0 911 997 A2    4/1999

(Continued)

OTHER PUBLICATIONS

Deri, R.J., et al., "Integrated waveguide/photodiodes using vertical impedance matching", Appl. Phys. Lett., vol. 56, No. 18, 1737-39, (1990).*

(Continued)

*Primary Examiner*—Brian Healy
*Assistant Examiner*—Charlie Peng
(74) *Attorney, Agent, or Firm*—Freedman & Associates

(57) ABSTRACT

The invention discloses a method for monolithic integration of active devices within passive semiconductor waveguides and the application of this method for use in InP-based planar wavelength division multiplexing components of optical communication systems. The epitaxial device is grown in a single run and comprises a number of layers, such that the lower part of the structure acts as a single mode passive waveguide while the upper part of the structure contains a planar PIN diode. The PIN structure is present only in the active waveguide portion and absent in all the passive waveguide portions. The active and passive waveguide portions have substantially similar guiding properties with the exception of a mode tail above a top surface of the passive waveguide portion within the active waveguide portion. As a result, an optical signal portion penetrates the I-layer of the PIN structure and interacts with semiconductor material therein for actively affecting an intensity of the optical signal with no substantial changes in guiding properties of the semiconductor waveguide. Embodiments of invention in the form of monolithically integrated waveguide photodetector, electro-absorptive attenuator and semiconductor optical amplifier are disclosed in terms of detailed epitaxial structure, layout and performance characteristics of the device.

45 Claims, 7 Drawing Sheets

U.S. PATENT DOCUMENTS

| | | | |
|---|---|---|---|
| 5,973,339 A | | 10/1999 | Yokouchi et al. |
| 5,991,060 A | | 11/1999 | Fishman et al. |
| 6,310,995 B1 | * | 10/2001 | Saini et al. .................... 385/28 |
| 6,330,378 B1 | * | 12/2001 | Forrest et al. ................ 385/14 |
| 6,381,380 B1 | * | 4/2002 | Forrest et al. ................ 385/14 |
| 6,479,844 B1 | * | 11/2002 | Taylor ........................ 257/192 |
| 6,498,873 B1 | * | 12/2002 | Chandrasekhar et al. ..... 385/28 |
| 6,795,622 B1 | * | 9/2004 | Forrest et al. ................ 385/50 |

FOREIGN PATENT DOCUMENTS

| | | |
|---|---|---|
| JP | 11145441 | 5/1999 |

OTHER PUBLICATIONS

Deri et al., "Integrated Waveguide/Photodiodes Using Vertical Impedance Matching", Applied Physics Letters, American Institute of Physics, vol. 56, No. 18, Apr. 30, 1999, pp 1737-1739.

Deri, "Monolithic Integration of Optical Waveguide Circuitry With III-V Photodetectors for Advanced Lightwave Receivers", Journal of Lightwave Technology, IEEE, vol. 11, No. 8, Aug. 1, 1993, pp 1296-1313.

Jiang et al., "High-Power Waveguide Integrated Photodiode With Distributed Absorption", IEEE MTT-S International Microwave Symposium Digest, vol. 2 of 3, Jun. 11, 2000, pp 679-682.

Deri et al., "Efficient Vertical Coupling of Photodiodes to InGaAsP Rib Waveguides", Applied Physics Letters, American Institute of Physics, vol. 58, No. 24, Jun. 17, 1991, pp2749-2751.

Miller et al., "Band-Edge Electroabsorption in Quantum Well Structures: The Quantum-Confined Stark Effect", Phyiscal Review Letters, vol. 53, No. 22, Nov. 26, 1984, pp 2173-2176, XP000571007.

Thijs et al., "Progress in Long-Wavelength Strained-Layer InGaAs(P) Quantum-Well Semiconductor Lasers and Amplifiers", IEEE Journal of Quantum Electronics, vol. 30, No. 2, Feb. 1, 1994, pp 477-498, XP000449499.

Li et al., "Novel Bias Control of Electroabsorption Waveguide Modulator", IEEE Photonics Technology Letters, vol. 10, No. 5, May 1998, pp 672-674, XP000754655.

\* cited by examiner

VERTICAL INTEGRATION OF ACTIVE DEVICES WITHIN PASSIVE SEMICONDUCTOR WAVEGUIDES

This application claims the benefit of U.S. Provisional Application No. 60/278,750, filed Mar. 27, 2001.

FIELD OF THE INVENTION

The invention relates generally to monolithic integration of active semiconductor devices onto passive waveguides of planar wavelength division multiplexing (WDM) components and more particularly to waveguide photodetectors (WPD), electro-absorptive attenuators (EAA) and semiconductor optical amplifiers (SOA), all having a PIN structure on top of a passive seiniconductor waveguide and, in use, acting as a single-mode waveguide device with either 1) high-efficiency photodetection, due to direct interband transitions in the I-layer of a reverse-biased PIN structure, or 2) variable optical attenuation, due to interband electro-absorption in the I-layer of a reverse-biased PIN structure, or 3) variable optical amplification, due to stimulated radiative recombination of carriers injected into the I-layer of a forward-biased PIN structure.

BACKGROUND OF THE INVENTION

In many WDM components of optical communication systems, such as optical power (channel) monitors or dynamic gain (channel) equalizers, the incoming multi-wavelength signal is first spectrally dispersed, then detected and/or processed on a per wavelength basis, and, optionally, multiplexed back into the multi-wavelength outgoing signal. A common method of achieving the required functionality typically relies on hybrid integration of discrete passive devices, such as optical spectral analyzer, and active devices, such as photodetectors,; attenuators, or amplifiers. Examples of this approach are found in U.S. Pat. No. 6,327,075 by Ishii, issued 4 Dec. 2001 and U.S. Pat. No. 6,268,945 by Roberts, issued 31 Jul. 2001. While simple engineering solutions resulting in hybrid components are functionally attractive for some applications, they may be prohibitively cumbersome and costly for others. The search for more compact and cost efficient solutions has naturally resulted the development of integrated planar waveguide components, e.g. those reported by C. Cremer et al, in "Grating Spectrograph Integrated with Photodiode Array in InGaAsP/InGaAs/InP", *IEEE Photon. Technol. Lett*, Vol. 4, P. 108, 1992; by J. B. Soole et al, in "Integrated Grating Demultiplexer and pin array for High-Density Wavelength Division Multiplexed Detection at 1.55 µm", *Electron. Lett.*, Vol. 29, P. 558, 1993; by M. R. Amersfoort et al, in "Low-Loss Phased Array Based 4-channel Wavelength Demultiplexer Integrated with Photodetectors", *IEEE Photon. Technol. Lett*, Vol. 6, P. 162, 1994; by M. Zirngibl et al, in "WDM Receiver by Monolithic Integration of an Optical Preamplifier, Waveguide Grating Router and Photodetector Array", *Electron. Lett.*, Vol. 31, P. 581, 1995; by C. R. Doerr et al, in "Dynamic Wavelength Equalizer in Silica Using the Single-Filtered-Arm Interferometer", *IEEE Photon. Technol. Lett.*, Vol. 11, P. 581, 1999; by P. M. J. Schiffer et al, in "Smart Dynamic Wavelength Equalizer with On-Chip Spectrum Analyzer", *IEEE Photon. Technol. Lett.*, Vol. 12, P. 1019, 2000. In these components, the optical spectral analyzer most commonly used is either an echelle waveguide grating or an arrayed waveguide grating (AWG) and the active devices are integrated within the passive ridge waveguides, physically separating the individual wavelength channels. As a result, a compact and inexpensive integrated component for use in WDM systems is produced, provided a method for monolithic integration of active and passive waveguides is found that is feasible given existing production techniques as well as being cost efficient.

It is not at all trivial to combine passive waveguides used in optical spectral analyzers with active waveguide devices, such as WPDs, EAAs or SOAs, within the same semiconductor structure. This is because the passive and active semiconductor optical components typically have different bandgaps relative to their operating photon energy. One having skill in the art of designing active waveguide devices will be aware that the operating photon energy should be above the bandgap in a photodetector, close to the bandgap in an amplifier and well below the bandgap in a passive waveguide. Various methods for monolithic integration of active and passive semiconductor waveguides, which resolve this fundamental problem have been proposed, most of them involving one or both of the following major techniques: butt-coupling and evanescent-field coupling, as described in a review paper by R. J. Deri, "Monolithic Integration of Optical Waveguide Circuitry with III–V Photodetectors for Advanced Lightwave Receivers", *IEEE J. Lightwave Technol.*, Vol. 11, P. 1296, 1993. The former is straightforward but expensive and unreliable due to its difficulty in implementation, since it requires complex epitaxial growth techniques such as etch and re-growth, e.g. reported by S. Lourdudoss et al, in "Uniqueness of Hydride Vapour Phase Epitaxy in Optoelectronic Device Fabrocation", *Int. Conf. Indium Phosphide and Related Materials*, May 11–15 May 1998, Tsukuba, Japan, P. 785, or selective area growth, e.g. reported by D. Jahan et al, "Photonic Integration Technology without Semiconductor Etching" *Int. Conf. Indium Phosphide and Related Materials*, 16–20 May 1999, Davos, Switzerland, P. 28. The latter uses simple single-step epitaxial growth, but has problems with coupling efficiency between passive and active waveguides, when the active waveguide is grown on top of the passive one. In attempts to achieve good and wavelength-independent coupling efficiency for two vertically integrated waveguides, various sophisticated techniques have been proposed, e.g. such as those disclosed by B. Mersali et al, in "Optical-Mode Transformer: A III–V Circuit Integration Enabler", *IEEE J. Selected Topics in Quantum Electron.*, Vol. 3, P. 1321, 1997; by P. V. Studenkov et al, "Efficient Coupling in Integrated Twin-Waveguide Lasers Using Waveguide Tapers", *IEEE Photon. Technol. Lett.*, Vol. 11, P. 1096, 1999; or by S. S. Saini et al, "Passive-Active Resonant Coupler (PARC) Platform with Mode Expander", *IEEE Photon. Technol. Lett.*, Vol. 12, P. 1025, 2000. However, none of them are both simple to implement and cost efficient at present and hence these approaches also do not solve the problem of developing reliable and inexpensive integrated devices for sale and distribution in the very near term.

OBJECT OF THE INVENTION

In order to overcome drawbacks of the prior art it is an object of the invention to provide a method for integrating active devices within passive semiconductor waveguides of planar WDM components with improved manufacturability.

SUMMARY OF THE INVENTION

The invention describes a monolithically integrated semiconductor waveguide device with active and passive semiconductor waveguide portions comprising: a passive waveguide portion for single-mode guiding of light propagating therein, and an active waveguide portion provided by disposing additional layers which form a PIN structure on top of the passive waveguide portion, the active waveguide portion having waveguide properties substantially similar to those of the passive waveguide portion with the exception of a mode tail above a top surface of the passive waveguide portion within the active waveguide portion, such that, in use, an optical signal propagating within the active waveguide portion penetrates an I-layer of the PIN structure and interacts with semiconductor material therein for actively affecting an intensity of the optical signal with no substantial changes in guiding properties of the semiconductor waveguide.

Additionally, the invention teaches an integrated waveguide comprising: a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide.

Further, the invention teaches an integrated waveguide comprising: a passive waveguide portion for single-mode guiding of light propagating therein and having a top surface, an active portion disposed on the top surface for providing both a monitoring control signal in dependence upon the intensity of the light propagating through the integrated waveguide and electro-absorption of light propagating within the integrated waveguide in the active portion in dependence upon a control voltage, and a controller for receiving the monitoring control signal and for providing the control voltage to the active portion in dependence thereon.

The invention also teaches a method of affecting an optical signal within an integrated waveguide comprising: providing a passive optical waveguide having a top surface and for guiding light with a single mode and having a first mode profile; providing an active layer disposed on the top surface of the passive optical waveguide thereby producing an active portion, the active portion having a second mode profile similar to the first mode profile about a central portion of the mode profile but differing substantially from the first mode profile in at least a region of the mode profiles other than the central portion; providing an optical signal propagating within the waveguide; and, actively affecting an intensity of the propagating optical signal by affecting that portion of the propagating light corresponding to the portion of the second mode profile that differs substantially.

The invention also describes an integrated active optical component comprising: an active waveguiding portion formed of a passive waveguide structure and an active element disposed adjacent thereto, wherein the passive waveguide structure has a first optical mode field absent the active element and wherein the active waveguiding portion has a second other optical mode field, wherein the first optical mode field and the second other optical mode field are similar differing substantially only outside of the central portion of the mode field.

BRIEF DESCRIPTION OF THE DRAWINGS

The invention will now be described with reference to the drawings in which.

DETAILED DESCRIPTION OF THE INVENTION

Figure 1:
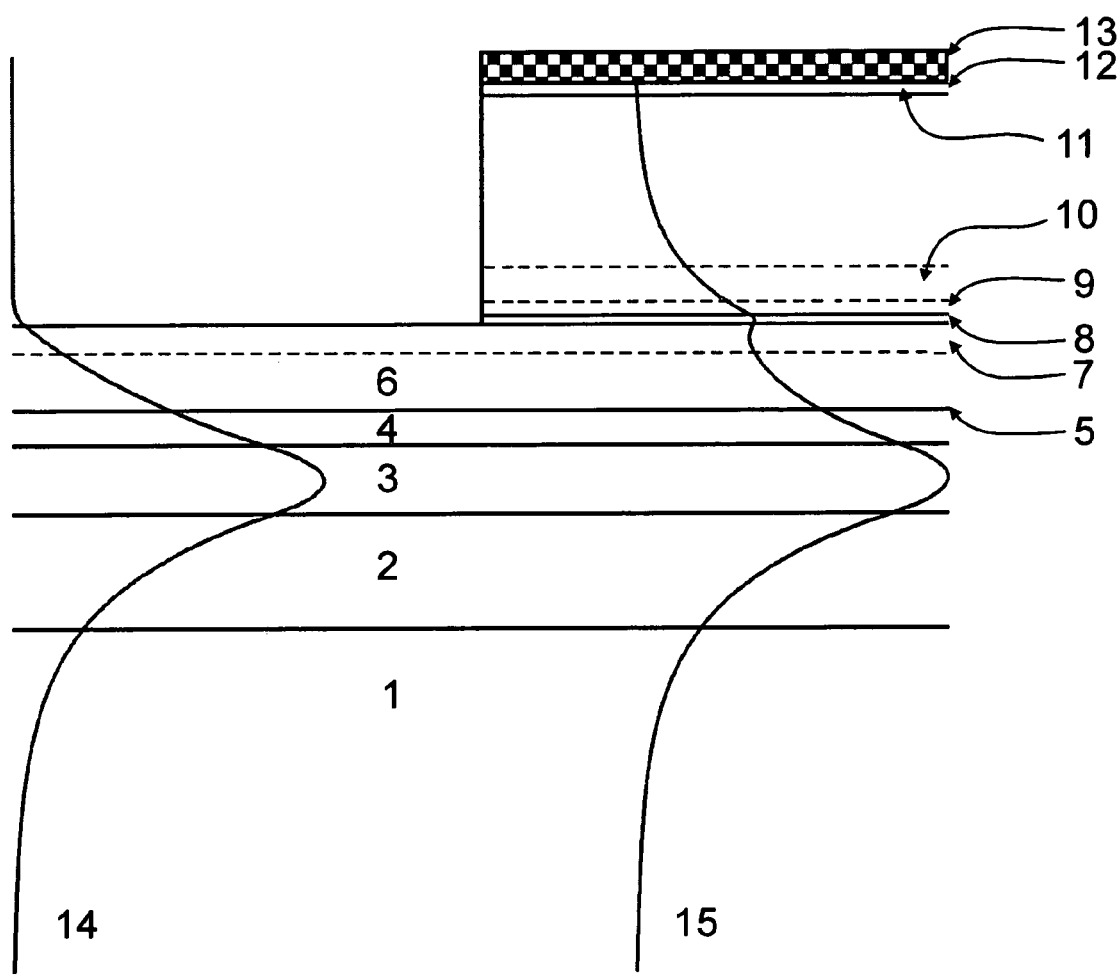
FIG. 1 is a graphic representation of the layer structure and the optical field profile of the only vertical mode in the passive (left) and active (right) portions of the waveguide device.

Referring to FIG. 1, an embodiment of the invention in the form of a layered structure of the passive waveguide portion is shown on the left half of FIG. 1 and a corresponding layered structure of the active waveguide portion of a same device is shown on the right half of FIG. 1. The passive waveguide portion is designed to be a low-loss and low-birefringence waveguide. It comprises a number of layers grown on and lattice matched to the undoped substrate 1: a buffer layer 2, a waveguide core layer 3, a lower cladding layer 4, an etch stop layer 5, and an upper cladding layer with two portions, 6 and 7, of which the top portion 7 is a heavily N-doped layer while the layers 2–6 all are undoped. The structure of the active waveguide portion (shown on the right half of FIG. 1) includes additional layers on top of the passive waveguide portion: an undoped active layer 8, spacer layer 9, P-contact layers 10 and 11, a cap layer 12 and a metalization layer 13. The layers above the active layer 8 are produced such that the level of P-doping rises from a negligible value in the spacer 9 to a very high ($\sim 1 \times 10^{19}$ $cm^{-3}$) level in the cap. In this embodiment, the material of choice is InP and related compound semiconductors, so that layers 2, 4, 6, and 7 are InP layers, while the waveguide core 3 and etch stop 5 are quaternary GaInAsP layers, while the cap layer 12 is a ternary GaInAs layer, all grown on and lattice matched to the InP substrate. The active layer 8 is the narrowest bandgap layer, and the material composition, strain and thickness of this layer are chosen on the basis of the device application, so that the bandgap $E_g$, defined as an energy separation between the lowest (sub)band in the conduction band and highest (sub)band in the valence band, is adjusted to the operating photon energy $\hbar\omega$ in some predetermined way. It may be a bulk ternary GaInAs (photodetecting) or a quaternary GaInAsP (attenuating or amplifying) layer or, alternatively, a photodetecting, attenuating or amplifying quantum well (QW) layer comprising one or more narrower bandgap wells separated by wider bandgap barriers. In this last case, either InGaAs/InP or InGaAsP/InP or InGaAs/InGaAsP or InGaAsP/InGaAsP or InGaAs/InAlAs pairs of materials, lattice matched or intentionally strained, are available as materials for well(s)/barriers. In any case, the entire layer structure is grown in a single step and then layers 8–12, absent in the passive waveguide portion, are etched out everywhere except in the active waveguide portion.

The properly designed layer structure ensures single vertical mode propagation within a waveguide portion absent an active device (left half of the FIG. 1) and within a waveguide portion having an active device (right half of the FIG. 1), so that the modes in the active and passive waveguide portions are substantially matched in terms of their propagation constants and field overlaps. Still, the profiles of the modes, indicated by 14 and 15 in FIG. 1, differ due to their mode tails above the passive waveguide structure. While in the passive waveguide portion the optical field 14 above the upper cladding drops sharply, in the active waveguide portion the optical field 15 has a formation in the formn of a peak or shoulder in the active layer 8, since this layer has a narrower bandgap and hence a higher refractive index than N- and P-contact InP layers below and above it. The mode field then drops smoothly towards the top metallization layer(s). Due to an overlap between the waveguide mode 15 and active layer 8, even though a relatively small one, light propagating through the active waveguide portion experiences either interband transition induced photodetection in the spectral range above the bandgap ($\hbar\omega > E_g$), or an electric field assisted interband absorption somewhat below the bandgap ($\hbar\omega < E_g$), or carrier injection produced interband amplification in the spectral range about the bandgap ($\hbar\omega \approx E_g$), depending on the device application. The response of the device is controlled through an electric bias applied between N- and P-contact layers on both sides of the active layer 8, which is reverse bias in a case of photodetection or electro-absorptive attenuation and forward bias in a case of amplification. It also depends on the confinement factor of the waveguide mode 15 with the active layer 8, which is limited by the requirement for having no more than one vertical mode in either TE (electric field of the mode in the plane of epitaxial growth) or TM (magnetic field of the mode in the plane of epitaxial growth) polarizations, for one thing, and the desire to minimize coupling loss and reflection at junction between the active and passive waveguide portions, for another. In a properly designed layer structure, the confinement factor of the only vertical mode with the active layer is about 1–2% which apparently limits the performance of the device. However, such a limitation is not critical for applications in relatively low speed WDM components. This is because a small overlap between the waveguide mode and the active layer atop the passive waveguide portion is easily compensated by increasing the length of the active waveguide portion, once device speed, limited by the capacitance, is not of concern. Practically, lengths a few mm for the active portion of the waveguide device would be sufficient for most applications.

At first glance, the layer structure shown in FIG. 1 is similar to that of a standard evanescent-field coupled device, e.g. integrated WPDs described in many earlier publications and exhaustively reviewed by R. G. Deri in "Monolithic Integration of Optical Waveguide Circuitry with III–V Photodetectors for Advanced Lightwave Receivers", *IEEE J. Lightwave Technol.*, Vol. 11, P. 1296, 1993. However, there is a fundamental difference between the two. The standard scheme of evanescent-field coupling implies that there is at least one more vertical mode in the active waveguide portion, with the field maximum within the active layer, and relies on a transfer of the single mode of the passive waveguide portion into this (those) higher mode(s). On the contrary, the integration method disclosed herein is based on the assumption that there is only one vertical mode (in each polarization) in the active waveguide portion, and that this mode substantially matches that of the passive waveguide portion. As a result, coupling between the active and passive portions of the two-section waveguide device is stable (high reproducibility from growth to growth) and very efficient. The stability of the coupling is due in part to a lack of intermode interference, since either section supports only one vertical mode. This type of performance is difficult to achieve with a standard evanescent-field vertical integration scheme according to the prior art, e.g. M. R. Amersfoort et al, "Low-Loss Phased Array Based 4-channel Wavelength Demultiplexer Integrated with Photodetectors", *IEEE Photon. Technol. Lett*, Vol. 6, P. 162, 1994; R. J. Deri, "Monolithic Integration of Optical Waveguide Circuitry with III–V Photodetectors for Advanced Lightwave Receivers", *IEEE J. Lightwave Technol.*, Vol. 11, P. 1296, 1993; and K. Steenbergen, "High-Capacity Integrated Optical Receivers", *Ph. D. Thesis Delft University of Technology*, The Netherlands, 1997.

The operation principles of specific devices using the integration method disclosed above, which is labeled as single-mode vertical integration, are now discussed with reference to FIGS. 2–4. The details of the layer structure and numerical examples are given by assuming InP-based devices designed for operating in C-band of 1.55 µm communication window at room temperature. It is apparent to those of skill in the art that though those details and examples provide a variety of embodiments, other layer structures and materials are also employable within the spirit and scope of the invention.

Figure 2:
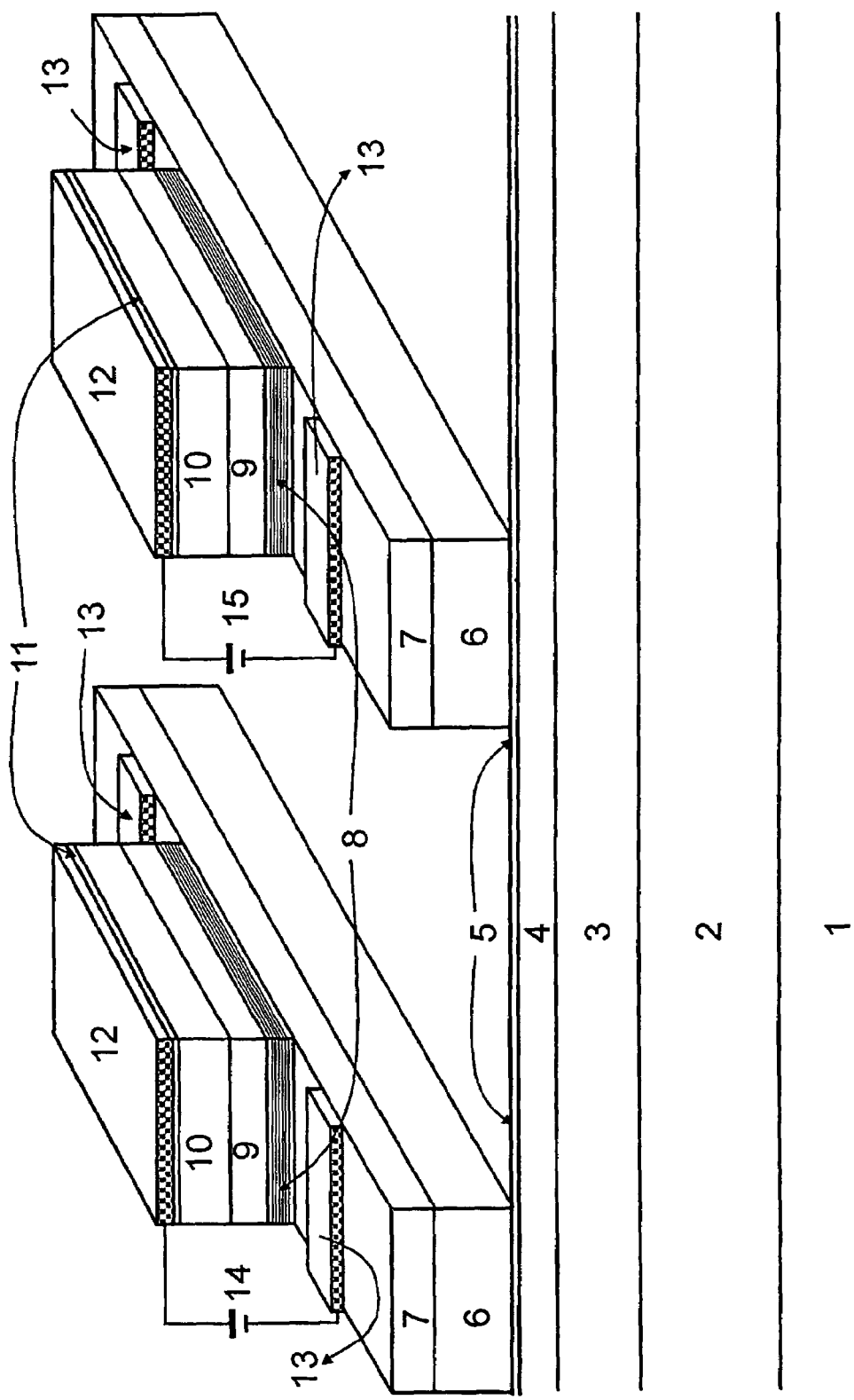
FIG. 2 is schematic layer structure and layout of the integrated WPD with end N-contacts.
Figure 3:
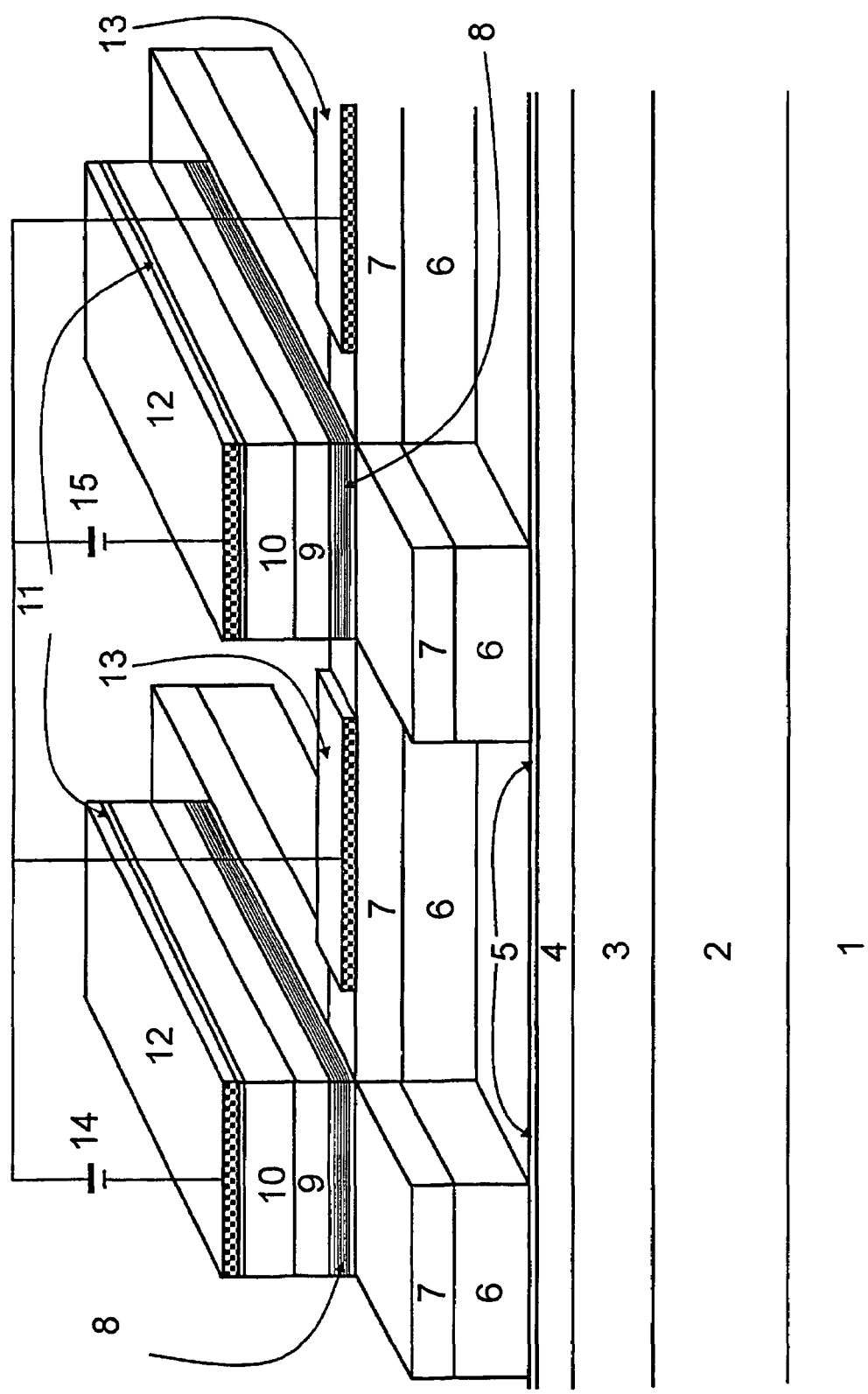
FIG. 3 is a schematic layer structure and layout of the integrated EAA with side N-contacts.
Figure 4:
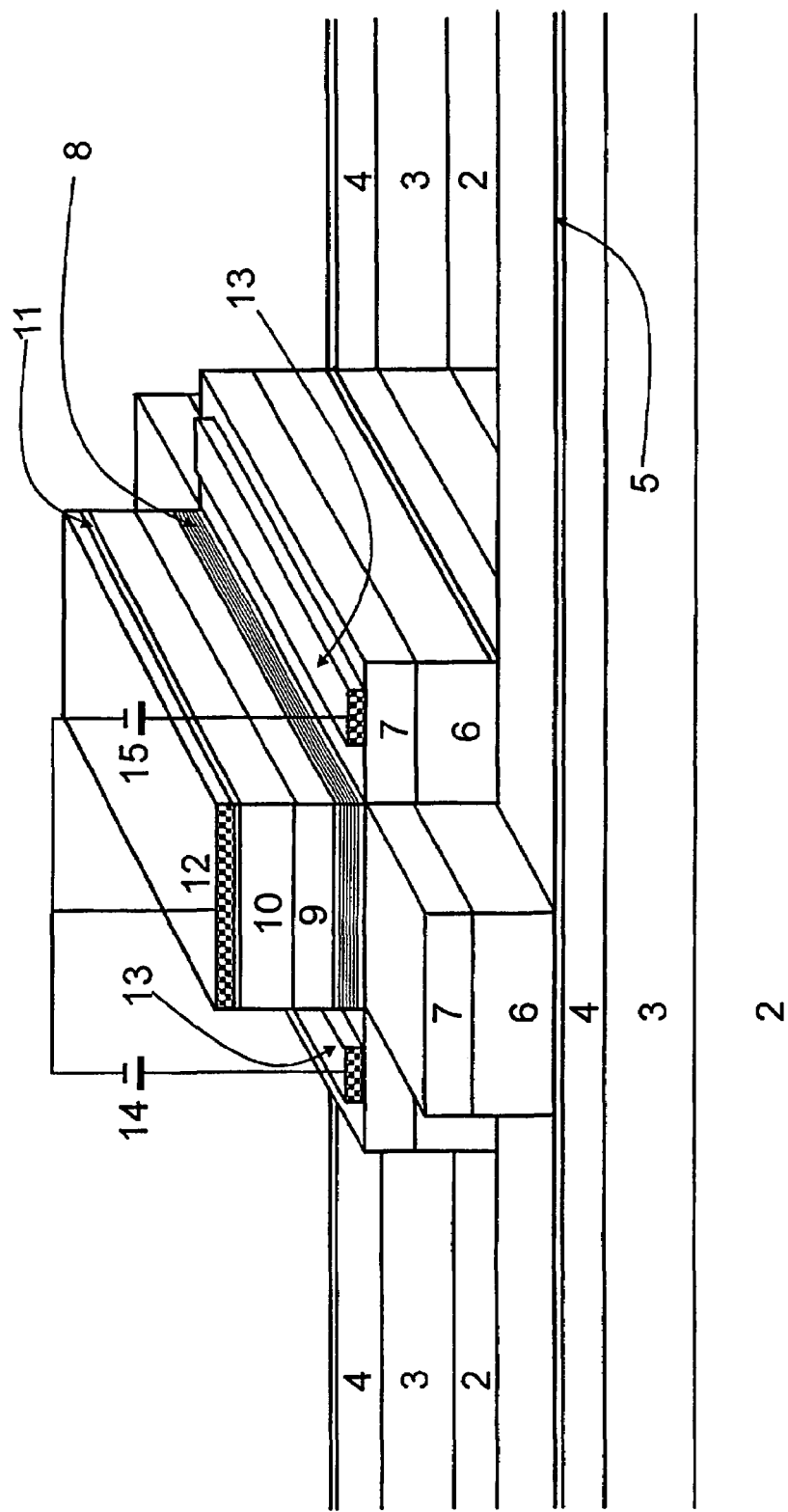
FIG. 4 is a schematic layer structure and layout of the integrated SOA with lateral N-contacts.

FIGS. 2–4 show the schematic layer structure and layout of possible InP-based waveguide devices using the single-mode vertical integration method. It is assumed that active devices may be integrated within passive waveguides of single-wavelength channels of planar WDM components, such as optical (de)multiplexers, and thus form an array of devices operating in different wavelengths. The devices shown in FIGS. 2–4 are similar in their layer structures 1–11 (to extend that the active layer 8 is specific to the embodiment, see below) and layout of P-contacts 12, but different in the layout of their N-contact(s) 13. This difference reflects two fundamental restrictions on device performance, associated with having the N-contact layer 7 of limited thickness and separated by limited distance from the waveguide core 3. First, the optical field on the upper boundary of the N-contact layer, even though it is relatively small, is not negligible. Otherwise it would not be coupled into the active layer 8 just above N-contact layer 7. It follows that the metal of the N-contacts 13 deposited on the N-contact layer 7 will introduce a certain amount of loss, should they be placed at the ends of the active portion of the waveguide device as shown in FIG. 2. Furthermore, this loss will be a polarization dependent loss (PDL) that results from the fact that the TM mode has higher optical field in the end N-contact than TE-mode. The problem is, however, solved by replacing the end N-contacts shown in FIG. 2 with the side N-contacts shown in FIG. 3. Second, an N-contact layer 7, of limited thickness and doping level, has substantial sheet resistance. In the device with either end or side N-contacts, shown in FIGS. 2 and 3, respectively, this results in a significant series resistance. Current flowing through this resistance may consume most of the applied electric bias and, additionally, lead to a release of substantial Joule power that would heat up the entire device and degrade its performance. Series resistance is reduced by about three orders of magnitude when the lateral N-contacts, shown in FIG. 4, are used rather than end or side N-contacts.

EXAMPLE

Integrated Waveguide Photodetector

Figure 5:
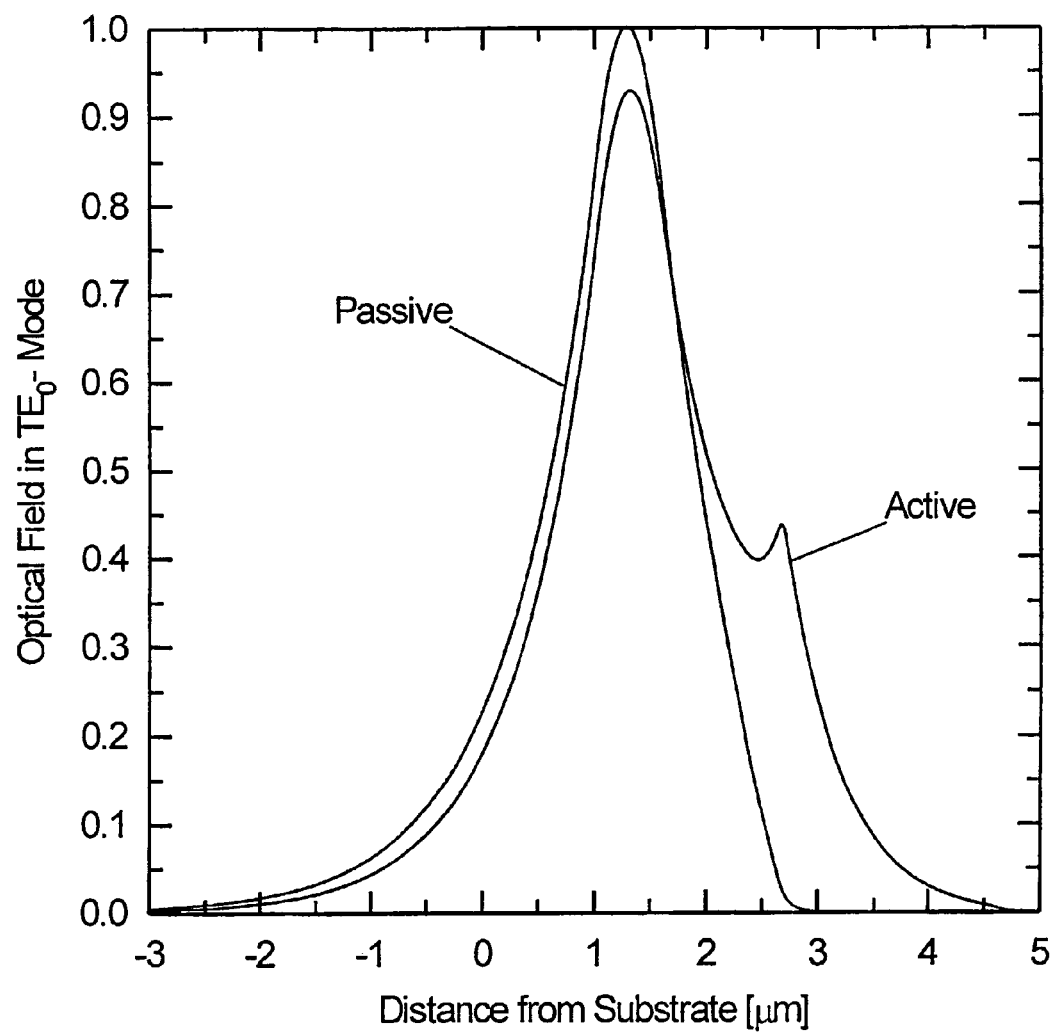
FIG. 5 is a graphic representation of the spatial distribution of the $TE_0$-mode optical field at a wavelength of 1.55 µm in the passive and active waveguide portions of the embodiment with layer structure given in Table I.

An exemplary embodiment of the invention in application to an integrated WPD, with the layer structure specified in Table I, and the device layout illustrated in FIG. 2, was designed and modeled. The epitaxial layers may be divided into two groups: waveguide layers (2–7) and photodetector layers (8–11). The device also has two metal contacts 12 and 13 of FIG. 2 (not present in Table I). The passive waveguide is designed to be a single-mode, low birefringence guide. This is a straightforward design used in planar waveguide demultiplexers, e.g. those described by E. S. Koteles in "Integrated Planar Waveguide Demiultiplexers for High-Density WDM Applications", *Wavelength Division Multiplexing. A Critical Review*, CR71, R. T. Chen & L. S. Lome, ed., SPIE, Bellingham, P. 3, 1999. Most of the optical mode in either TE or TM polarization is confined within the waveguide core 3, which is a relatively thick (0.6 μm) and low As composition (15.6%) quaternary layer. However, the overall thickness of the InP cladding layers above the core is just 1.05 μm, which allows the tail of an optical mode to reach the upper boundary of the waveguide. The N-doped upper part (0.25 μm in this particular structure) 7 of the InP cladding also serves as the N-contact layer of the planar PIN photodiode. Where this layer is disposed on top of the passive waveguide portion, as is the case in an active waveguide portion of the integrated WPD, the propagating light penetrates the photodetector layers. Both waveguide portions operate in a single vertical mode, which does not change substantially when light propagates from the passive to active portion of the waveguide as shown in FIG. 5. The effective index difference between the $TE_0$-mode in the active and passive waveguide portions of integrated WPD with the layer structure shown in Table I is as little as ~0.002, i.e. about 0.06%, while the mode field overlap between these two waveguide portions is about 0.952, corresponding to only 0.43 dB coupling loss in a slab waveguide geometry. In layman's terms, the active and passive waveguide portions of the integrated WPD are approximately mode matched. Still, there is a difference in the shapes of the mode in the active and passive waveguide portions that allows the mode to overlap the absorbing active layer 8. Although the confinement factor corresponding to the absorbing layer, $\Gamma_A$, is low—about 1.21% for TE polarization and 0.68% for TM polarization—the mode coefficient of absorption, α, which is substantially due to interband transitions within the active layer, is fairly high—about $4.7 \times 10^2$ dB/cm and $2.6 \times 10^2$ cm in TE- and TM-polarizations, respectively. Thus a reasonably long active waveguide portion will absorb and detect all the light, coupled to this active waveguide portion, in any polarization state. For the given exemplary layer structure of Table I, a WPD of just 1 mm length detects practically all the incoming light in either TE or TM polarization, with only 0.22% difference between the photocurrents associated with these two polarizations.

TABLE I

Possible Layer Structure of InP-based Monolithically Integrated WPD for Operating in 1.55 μm Communication Window at Room Temperature

| No | Layer | Material[1] | Doping | Thickness |
|---|---|---|---|---|
| 1 | Substrate | InP | U/D | 350+ μm |
| 2 | Buffer | InP | U/D | 1.0 μm |
| 3 | Core | InGaAsP[$\lambda_g$ = 1.0 μm] | U/D | 0.6 μm |
| 4 | Cladding | InP | U/D | 0.3 μm |
| 5 | Etch stop | InGaAsP[$\lambda_g$ = 1.3 μm] | U/D | 0.005 μm |
| 6 | Cladding | InP | U/D | 0.5 μm |
| 7 | N-contact | InP:S | $5 \times 10^{18}$ cm$^{-3}$ | 0.25 μm |
| 8 | Absorbing | InGaAs | U/D | 0.065 μm |
| 9 | Spacer | InP | U/D | 0.065 μm |
| 10 | P-contact | InP:Zn | $1 \times 10^{17}$ cm$^{-3}$ | 0.3 μm |
| 11 | P-contact | InP:Zn | $1 \times 10^{18}$ cm$^{-3}$ | 0.7 μm |
| 12 | Cap | InGaAs:Zn | $1 \times 10^{19}$ cm$^{-3}$ | 0.1 μm |

[1]All layers are lattice matched to InP substrate. Shown in parenthesis are the wavelengths corresponding to the bandgap in quaternary layers.

A WPD, as an end-point device in WDM components like optical power (channel) monitors, has to provide an estimate for optical power $P_\omega$ in a single wavelength channel with photon energy $\hbar\omega$ by measuring the photocurrent $J_\omega$ in this particular channel, which is physically separated from other channels by a demultiplexer. Two important characteristics of this device are the responsivity $\Re_\omega$ and dynamic range $\{P_{\omega,min}, P_{\omega,max}\}$. By assuming that the active waveguide portion is long enough to completely absorb all the light coupled into this portion, the former is defined as $$\Re_\omega \equiv \frac{J_\omega}{P_\omega} = \eta_C \eta_P \frac{e}{\hbar\omega} \quad (1)$$

with $\eta_C$ as the coupling efficiency between the active and passive waveguide portions, $\eta_P$ as the quantum yield in the active waveguide portion, and e as the charge of an electron. In the ideal device with both $\eta_C$ and $\eta_P$ equal to unity, the responsivity at 1.55 μm wavelength would be 1.25 A/W. The actual responsivity of the WPD is somewhat lower, due to coupling loss, recombination loss, and propagation loss independent from interband absorption. Coupling loss in the slab waveguide with a layer structure given in Table I is roughly 0.43 dB, which is somewhat more than that in the ridge waveguide shown in FIG. 2 with an otherwise equivalent layer structure. Recombination of photogenerated carriers in a PIN double heterostructure with that thin narrower bandgap absorbing layer and with a quality of heterointerfaces typical for modern growth techniques is substantially negligible. Then, the quantum yield photogeneration efficiency is determined as $$\eta_P = \frac{\alpha_{IB}}{\alpha_0 + \alpha_{IB}}, \quad (2)$$

where $\alpha_{IB}$ and $\alpha_0$ are the contributions of the interband transitions in the absorbing layer 7 and all the other mechanisms of propagation loss, respectively, to the mode coefficient of absorption $\alpha = \alpha_0 + \alpha_{IB}$. Typically, $\alpha_0$ does not exceed a couple of dB/cm, while $\alpha_{IB}$ is well in the hundreds of dB/cm, i.e. even in a WPD with a very thin absorbing layer the quantum yield is close to unity. That brings us to an estimate of responsivity as $\mathcal{R}_\omega \leq 1.1$ A/W, which indeed is a very high value for this parameter.

The dynamic range of the device is determined as an input power window, within which a registration of the photocurrent occurs with a certain level of confidence. Minimum input power in each wavelength channel, $P_{\omega,min}$, is limited by the noise and dark currents of a photodiode. Assuming room temperature operation and taking into account that the electric passband of the device is restricted by its RC-time constant and thus amounts to ~100 MHz for a 1 mm long device, it is easily found that the noise current is dominated by the shot noise. It is estimated as ~16 pA for a device with the layer structure given in Table I, that would result in $P_{\omega,min} \approx -80$ dBm, should the noise be a limiting factor. Most probably, however, it is the dark current that limits the detected optical power on the low power side. Still, the dark current ~300 pA at reverse bias of ~-5 V in 1nun long device with the layer structure given in Table I is not seen to be unreasonable, which suggests that $P_{\omega,min} \approx -65$ dBm, at the very least. As to the maximum input power, $P_{\omega,max}$, this is limited primarily by nonlinear saturation effects in the process of photodetection. This process relies on collecting the photocarriers, generated in the absorbing layer 8, by the N- and P-contact layers below and above that layer, respectively. An efficient collection of photocarriers requires high electric field in the absorbing layer and adjusted space-charge regions of the contact layers that is normally reached by reverse electrical biasing of the PIN structure. However, it is expected that at high optical powers, either the electric field in the absorbing layer will be screened by photocarriers or the local reverse bias will be reduced by the voltage drop in the contact layers, caused by the photocurrent. In the particular case of the integrated device disclosed herein, the second mechanism is more important, since the very principle of the single-mode vertical integration assumes that the N-contact layer 7 is quite resistive. The voltage drop $\Delta V$ across the N-contact layer of length $l_N$, assuming that the only metal contact to this layer is positioned at the output end of the active portion of the waveguide device, is estimated as $$\Delta V \approx \frac{l_N \rho_N}{w_N} \mathcal{R}_\omega P_\omega, \quad (3)$$

where $l_N$, $w_N$ and $\rho_N = 1/(e\mu_N N d_N)$ are the length, width and sheet resistance of the N-contact layer 7, respectively, with $\mu_N$ as the electron's mobility, N as the concentration of electrons and $d_N$ as the thickness of the N-contact layer. In a device with the layer structure of Table I, the sheet resistance is estimated as $\rho_N \approx 40 \Omega$. By taking $l_n \approx 1$ mm and $w_N \approx 4$ µm as reasonable values for the length and width of the N-contact layer, respectively, Eq. (3) predicts a voltage drop of about 10 V for each mW of the input optical power. Because of this voltage drop, the actual reverse bias of a PIN structure is lower than that applied between the contacts, the difference between the two growing with increasing distance from the N-contact. Assuming a typical operating voltage of -5 V, which is the voltage 14 (15) between the P- and N-contacts, 12 and 13, respectively, in FIG. 2, and admitting that the reverse bias in any point across the WPD should not be above -2 V, one finds that high electric resistance of the N-contact layer 7 limits the input optigal power to $P_{\omega,max} \approx -5$ dBm. Optionally, if the dynamic range of WPD has to be extended towards higher powers, another N-contact is positioned at the input end of the active portion of the device or, alternatively, two or more side N-contacts, such as those shown in FIG. 3, are used rather than the end N-contacts.

EXAMPLE

Integrated Electro-Absorptive Attenuator

Figure 6:
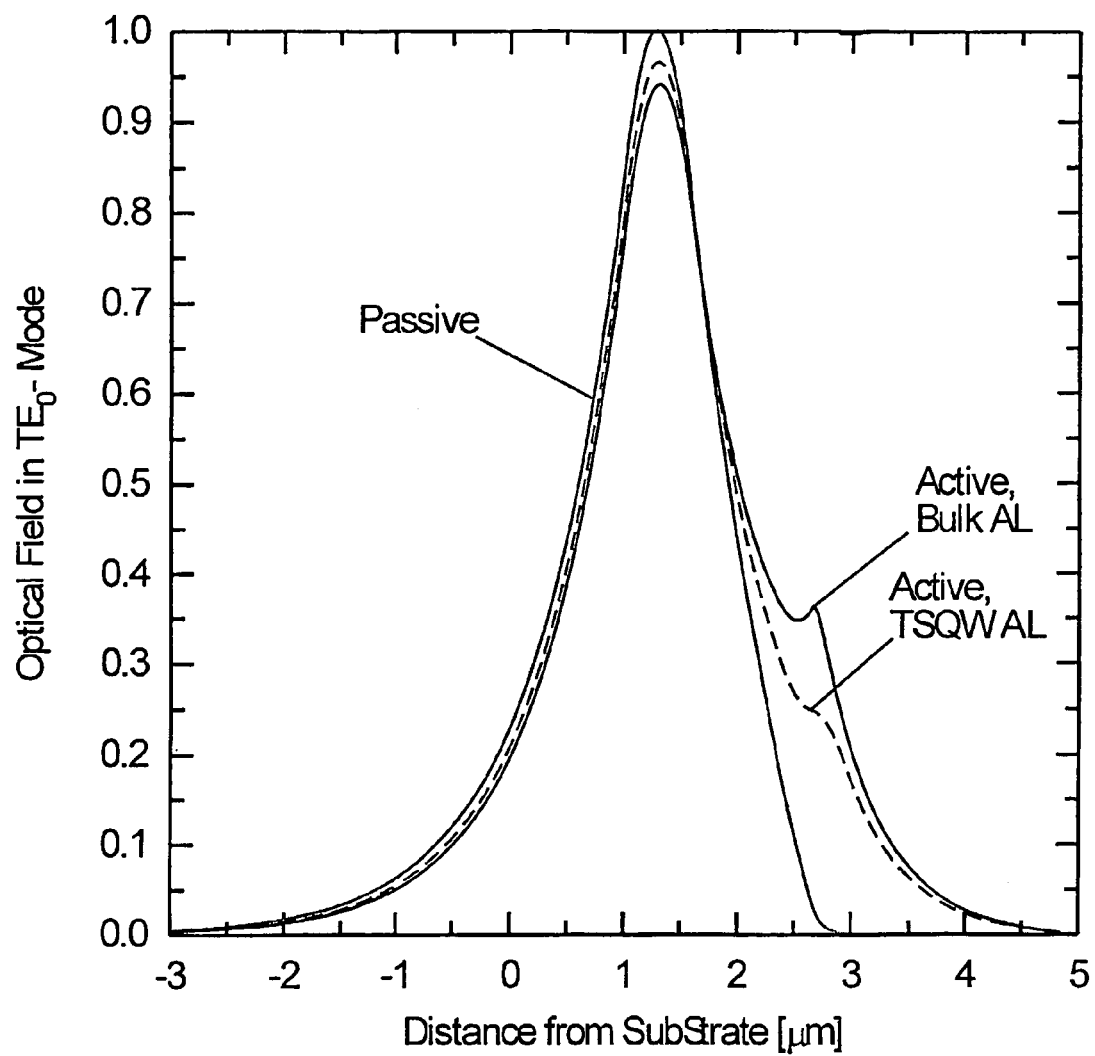
FIG. 6 is a graphic representation of the spatial distribution of $TE_0$-mode optical field at a wavelength 1.55 µm in the passive and active waveguide portions of the embodiment with layer structure given in Tables IIA (solid line) and IIB (dashed line)

Also, an exemplary embodiment of the invention in application to an integrated EAA, with the layer structure specified in Table IIA and the device layout illustrated in FIG. 3, was designed and modeled. The distribution of the vertical mode field in the passive and active waveguide portions is shown in FIG. 6. The layer structure of the integrated EAA is similar to that of the integrated WPD, an embodiment disclosed above. The only difference appears in the material of the active layer 8 and also in the thickness of the spacer layer 9 immediately above the active layer. The interband absorption in the active layer, which is still the narrowest bandgap layer but now has the bandgap energy slightly above the operation photon energy, occurs only in a relatively high electric field. Some increase in the spacer thickness improves the overlap between the optical mode field and electric field of PIN structure. The layout of the device also is similar to that of the WPD. However, even though end N-contacts such as those shown in FIG. 2 also are employable in this embodiment, higher operating power and lower tolerance to insertion loss in applications for which EAA is intended, such as dynamic channel equalization, make the design using the side N-contacts shown in FIG. 3 preferable. One or more side N-contacts 13 schematically shown in this figure are optionally positioned anywhere along the active portion of the waveguide device. This configuration eliminates PDL associated with the end N-contacts and, in a case of multiple side N-contacts, substantially reduces the voltage drop across the N-contact layer. At the same time, it introduces some extra loss, similar to that at a waveguide crossing. It is felt, however, that a proper design of the side N-contacts 13 will keep this loss at a level well below 0.1 dB per crossing, as is the case with conventional waveguide crossing, e.g. reported by H. G. Bukkems et al, in "Minimization of the loss of integrated waveguides in InP-based photonics integrated circuits", *IEEE Photonics Technol. Lett.*, Vol. 11, P. 1420, 1999.

TABLE IIA

Possible layer structure of InP-based monolithically integrated EAA with a bulk active layer for operating in 1.55 µm communication window at room temperature.

| No | Layer | Material[1] | Doping | Thickness |
|---|---|---|---|---|
| 1 | Substrate | InP | U/D | 350+ µm |
| 2 | Buffer | InP | U/D | 1.0 µm |
| 3 | Core | InGaAsP[$\lambda_g$ = 1.0 µm] | U/D | 0.6 µm |
| 4 | Cladding | InP | U/D | 0.3 µm |
| 5 | Etch stop | InGaAsP[$\lambda_g$ = 1.3 µm] | U/D | 0.005 µm |
| 6 | Cladding | InP | U/D | 0.5 µm |
| 7 | N-contact | InP:S | $5 \times 10^{18}$ cm$^{-3}$ | 0.25 µm |
| 8 | Electro-Absorbing | InGaAsP[$\lambda_g$ = 1.43 µm] | U/D | 0.08 µm |
| 9 | Spacer | InP | U/D | 0.12 µm |
| 10 | P-contact | InP:Zn | $1 \times 10^{17}$ cm$^{-3}$ | 0.3 µm |
| 11 | P-contact | InP:Zn | $1 \times 10^{18}$ cm$^{-3}$ | 1.5 µm |
| 12 | Cap | InGaAs:Zn | $1 \times 10^{19}$ cm$^{-3}$ | 0.1 µm |

[1]All layers are lattice matched to InP substrate. Shown in parenthesis are the wavelengths corresponding to the bandgap in quaternary layers.

The operation principles of this embodiment in form of an integrated EAA are based on controlling the interband absorption in the active layer 8, in the spectral range of photon energies somewhat below the bandgap in this layer, $\hbar\omega<E_g$, by changing the vertical quasi-static electric field F therein. In the embodiment disclosed in Table IIA, the electro-absorbing layer 8 is a bulk direct-gap semiconductor material wherein the mechanism of absorption below the bandgap is associated with electric field assisted interband tunneling, known as the Franz-Keldysh effect (FKE) and first reported by W. Franz in *Z. Naturforsch*. T. A 13, P. 484, 1958 and L. V. Keldysh in *Zh. Exp. Teor. Fiz.*, T. 34, S. 1138, 1958 (*Sov. Phys.—JETP*, Vol. 7, P. 788, 1958). The quasi-static electric field in the active layer 8 is tuned by alternating the reverse electric bias 14 (15) of the PIN structure, according to the sketch of a waveguide device shown in FIG. 3. The device design is such that at zero bias field-assisted interband transitions in the active layer 8 are not very probable and, therefore, the active waveguide portion has a relatively low propagation loss. However, the probability of field-assisted interband tunneling and hence the absorption loss grows with an increase of reverse bias. As a result, the transmission of this active waveguide portion is controlled by the reverse bias of the PIN structure. Thus, the integrated EAA operates as a voltage-controlled variable optical attenuator, in contrast to most previous art using current-controlled devices, such as, those based on a phase modulation in branches of a Mach-Zehnder interferometer due to thermo-optical effect, as reported by C. R. Doerr et al, in "Dynamic Wavelength Equalizer in Silica Using the Single-Filtered-Arm Interferometer", *IEEE Photon. Technol. Lett.*, Vol. 11, P. 581, 1999; or the free-carrier plasma effect, as reported by I. E. Day et al, "Solid-State Absorption Attenuator in Silicon-on-Isolator with MHZ Bandwidth", *Paper Presented at NFOEC '01*, 2001. As in the case of any variable optical attenuator, which is an in-line optical component with light propagating through, the important characteristics of the device described by this embodiment are the insertion loss and dynamic range.

The insertion loss is determined by the loss in the N-contacts, which in the case of side contacts shown in FIG. 3 is the crossing loss, coupling loss at junctions between the active and passive waveguide portions, and propagation loss, mainly in the active waveguide portion. As mentioned above, the crossing loss with proper design and fabrication is easily reduced well below 0.1 dB per crossing. Coupling loss is estimated by the overlap integral between the mode fields in the active and passive waveguide portions of the integrated EAA and amounts to 0.3 dB per single pass for the embodiment with the layer structures given in Table IIA. Propagation loss in the active portion of the waveguide device is primarily due to residual electroabsorption in the unbiased PIN structure, although intervalence band absorption in the P-contact layers provides some contribution as well. The resulting propagation loss of the guided mode is estimated as $$\alpha_\omega(V) = \alpha_\omega^0 + \Gamma_\omega(V) A_\omega(V), \quad (4)$$

where the first and second terms on the right hand side account for the loss disconnected from the interband absorption and that due to interband absorption, respectively, with $\Gamma_\omega(V)$ and $A_\omega(V)$ as the mode confinement factor and material absorption corresponding to the active layer 8, both functions of the electric bias V. Then, the contribution of the propagation loss to the insertion loss is determined as the propagation loss at zero bias, i.e. $\alpha_\omega(0) = \alpha_\omega^0 + \Gamma_\omega(0) A_\omega(0)$. For the embodiment with the layer structure given in Table IIA, $\alpha_\omega^0$ is expected to be about 1 dB/cm, assuming state of the art growth and fabrication technologies that reduce the scattering loss in the transparent ridge waveguides to just a fraction of dB/cm, e.g. as reported by R. J. Deri et al, in "Low-loss III–V Semiconductor Optical Waveguides", *IEEE J. Quantum Electron.*, Vol. 26, P. 640, 1991. For the same embodiment, the confinement factor of the single waveguide mode with the active layer 8 is roughly 1% (~1.2% for TE-polarization and ~0.8% for TM-polarization). These values do not depend much on the bias since the device is designed for electroabsorption rather than for electrorefraction. The material absorption, $A_\omega$, has a sharp and highly nonlinear dependence on the electric field, F, in the active layer and also is very sensitive to the deficit of photon energy therein, $E_g - \hbar\omega > 0$, both due to the tunneling nature of the electroabsorption below the bandgap. At the same time, the material absorption in the bulk active layer does not really depend on the polarization of light. For the embodiment with the layer structure given in Table IIA, at zero bias $F \leq 4 \times 10^4$ V/cm which ensures that $\Gamma_\omega(0) A_\omega(0) \leq 1$ dB/cm across the entire C-band in either polarization. Overall, the insertion loss of the EAA with the layer structure of Table IIA and a 2 mm long active portion, which combines the contact, coupling and propagation loss, is roughly 1 dB at the blue edge of C-band and somewhat less (~0.8 dB) at the red edge of C-band.

The dynamic range of the integrated EAA is determined by its variable attenuation range and the input power range that enables this attenuation range. The attenuation range is defined as a maximum to minimum transmission ratio, where maximum and minimum transmissions are those at zero and the highest possible reverse biases, respectively. The upper limit of the reverse bias apparently is restricted by electric breakdown of the PIN structure, but it also depends on the design of the voltage controller. By any account, however, a reverse bias of up to ~12 V does not seem to be unreasonable considering the embodiment given in Table IIA. At such a bias, the electric field in the active layer reaches F ~3.6×10⁵ V/cm which brings the material electroabsorption therein above $1.8 \times 10^3$ cm$^{-1}$ even at the red edge of C-band, resulting in at least 15 dB attenuation range over the entire C-band. In fact, the variable attenuation range is well above 15 dB for most wavelengths within this band. The lower limit of the input power range, within which 15 dB range of attenuation is achievable, is really limited only by the noise floor of the optical signal. On the higher power side, the limitation is due to the same saturation effects as those discussed above referring to the embodiment in the form of the WPD. The major one is associated with the voltage drop across the highly resistive N-contact layer 7, caused by the photocurrent generated as a result of interband electroabsorption in the active layer 8. This voltage drop reduces the actual bias of the PIN structure V(x), which becomes a function of the coordinate in the direction of propagation, x. Since the coefficient of the interband absorption and hence the propagation loss heavily depend on the local bias of the PIN structure, both are suppressed by photogeneration which is seen as saturation of the electroabsorptive attenuation at high optical powers. Propagation in such a nonlinearly absorbing active waveguide portion is optionally described through the coordinate dependence of the optical power, $P_\omega(x)$, and bias voltage, V(x), which have to satisfy the system of nonlinear equations:

$$\frac{dP_\omega}{dx} = -[\alpha_\omega^0 + \alpha_\omega^{IB}(V)]P_\omega \qquad (5)$$

$$\frac{d^2V}{dx^2} = -\frac{e\rho_N}{\hbar\omega w_N}\alpha_\omega^{IB}(V)P_\omega ,$$

where $\alpha_\omega^{IB}(V) = \Gamma_\omega(V)A_\omega(V)$ is the contribution from the interband electroabsorption in the active layer to the propagation loss of the mode. The boundary conditions to these equations are formulated in terms of the optical power at the start of the active waveguide portion and the electric bias of the PIN structure on each N-contact. Numerical simulations based on these equations predict that for an embodiment with the layer structure given in Table IIA, 3–4 side N-contacts of the kind shown in FIG. 3 will keep the voltage drop between the contacts below 1 V, provided the input optical power is equal to or below 5 dBm. Thus, the EAA described herein is expected to provide at least 15 dB variable attenuation for an optical signal with a power at the device input port up to 5 dBm in a spectral range over the entire C-band at a voltage equal to or below 12 V. Given that this device has a transient time limited by its RC-constant, similar to the previously described embodiment in the form of a WPD, the electrical bandwidth of the EAA with a 2-mm long active portion is estimated to be roughly 25 MHz.

Yet another exemplary embodiment of the invention in the form of an integrated EAA has the layer structure specified in Table IIB and a device layout illustrated in FIG. 3. The distribution of the vertical mode field in the passive (solid line) and active (dashed line) waveguide portions is shown in FIG. 6. This device is similar to that disclosed above referring to Table IIA but has QWs rather than bulk semiconductor material for the electro-absorbing active layer 8. Specifically, this is a stack of 6 44-nm quaternary $Ga_{0.071}In_{0.929}As_{0.171}P_{0.829}$ layers as barriers and 5 7-nm ternary $Ga_{0.6}In_{0.4}As$ layers as wells. These ternary wells are strained in a tensile manner at about 0.9%, while the quaternary barriers are compressively strained, to a much lesser degree of 0.05%. The resulting quantum subband structure is such that the upper hole subband is the light hole subband corresponding to a bandgap wavelength of about 1430 nm and the bandgap involving the heavy hole subband is some 20–25 nm shorter, in terms of bandgap wavelengths. It is well known that inverting the relative positions of the light and heavy hole subbands, achieved byintroducing a certain amount of controllable tensile strain into the wells, are optionally used for enhancing the intensity of interband transitions in the TM polarization (magnetic field of the optical signal in the plane of the wells) versus the TE polarization (electric field of the optical signal in the plane of the wells), as reported by J. E. Zuker et al, in "Optical Transitions in Strained InGaAs/InGaAs Quantum Wells", *IEEE Photonics Technol. Lett.*, Vol. 4, P. 432, 1992; or Cheung et al, in U.S. Pat. No. 5,117,469 (May 1992). Also, a QW active layer optically behaves as a uniaxially anisotropic material, which has slightly different refractive indexes in the TE and TM polarizations. When the wells are strained in a tensile manner as described above, the material birefringence of the QW active layer is such that light in the TM polarization sees higher refractive index than light in the TE polarization, as reported by Zucker in U.S. Pat. No. 5,090,790 (February 1992); or by J. E. Zuker et al, in "Strained Quantum Wells for Polarization-Independent Electrooptic Waveguide Switches", *J. Lightwave Technol.*, Vol. 10, P. 1926, 1992. As a result, the confinement factor of the TM-mode with the active layer increases and approaches that of the TE-mdde, which in a waveguide made up from optically isotropic materials, is higher, as described in the textbook "Theory of Dielectric Optical Waveguides", 2$^{nd}$ ed., *Academic Press*, 1991 by Marcuse. For an embodiment with the layer structure given in Table IIB, the confinement factor with the active layer is 1.74% for the TE-mode and 1.68% for the TM-mode.

TABLE IIB

Possible Layer Structure of InP-based Monolithically Integrated EAA With a Tensile-Strain Quantum Well Active Layer for Operating in 1.55 μm Communication Window at Room Temperature

| No | Layer | Material[1] | Doping | Thickness |
|---|---|---|---|---|
| 1 | Substrate | InP | U/D | 350+ μm |
| 2 | Buffer | InP | U/D | 1.0 μm |
| 3 | Core | InGaAsP[$\lambda_g$ = 1.0 μm] | U/D | 0.6 μm |
| 4 | Cladding | InP | U/D | 0.3 μm |
| 5 | Etch stop | InGaAsP[$\lambda_g$ = 1.3 μm] | U/D | 0.005 μm |
| 6 | Cladding | InP | U/D | 0.5 μm |
| 7 | N-contact | InP:S | $5 \times 10^{18}$ cm$^{-3}$ | 0.25 μm |
| 8 | Electro-Absorbing | 6 × 44 nm CS InGaAsP (barrier) + 5 × 7.2 nm TS InGaAs(well), $\lambda_g$ = 1.43 μm [LH1-C1 bandgap] | U/D | 0.3 μm |
| 9 | Spacer | InP | U/D | 0.02 μm |
| 10 | P-contact | InP:Zn | $1 \times 10^{17}$ cm$^{-3}$ | 0.3 μm |
| 11 | P-contact | InP:Zn | $1 \times 10^{18}$ cm$^{-3}$ | 1.5 μm |
| 12 | Cap | InGaAs:Zn | $1 \times 10^{19}$ cm$^{-3}$ | 0.1 μm |

[1]All the layers except those of electro-absorbing QW stack, are lattice matched to InP substrate. Shown in parenthesis are the wavelengths corresponding to the bandgap in quaternary layers. InGaAs QWs in electro-absorbing layer are tensile strained, InGaAsP barriers are, optionally, slightly compressive strained. Bandgap of ~1.43 μm in this layer is determined by the upper light hole subband, which is above the upper heavy hole subband due to a tensile strain.

The operating principle of this embodiment is similar to that of the embodiment disclosed in Table IIA and discussed above. Still, there is a difference in the actual characteristics of the device that is due to a difference in the mechanism of electroabsorption between the bulk and QW active layers. A quasi-static electric field applied in the direction of growth shifts the electron's and hole's dimension quantization levels towards each other, on one hand, and broadens these levels due to field-assistant tunneling, on another. This phenomenon, known as the quantum confined Stark effect (QCSE) and first reported by D. A. B. Miller et al, in "Band-Edge Electroabsorption in Quantum-Well Structures: The Quantum-Confined Stark Effect", *Phys. Rev. Lett.*, Vol. 53, P. 2173, 1984, is seen as an electric field induced increase in the interband absorption in a spectral range somewhat below the band gap. The electroabsorption in the QW active layer is determined mostly by the red shift of effective the bandgap at lower electric fields and tunnel broadening of the absorption edge at higher electric fields. In the classic limit, i.e. wide QWs with a small energy separation among the dimension quantization levels, the QCSE is naturally reduced to the FKE, as was shown by D. A. B. Miller et al, in "Relation Between Electroabsorption in Bulk Semiconductors and in Quantum Wells: The Quantum-Confined Franz-Keldysh Effect", *Phys. Rev. B*, Vol. 33, P. 6976, 1986. The details of the electroabsorption in QWs have been well studied both theoretically and experimentally, e.g. in publications: D. A. B. Miller et al, "Electric Field Dependence of Optical Absorption Near the Band Gap of Quantum-Well Structures", *Phys. Rev. B*, Vol. 32, P. 1043, 1985; D. A. B. Miller et al, "Electric-Field Dependence of Linear Optical Properties in Quantum Well Structures:

Waveguide Electroabsorption and Sum Rules", *IEEE J. Quantum Electron.*, Vol. QE-22, P. 1816, 1986; and S. Schmitt-Rink et al, "Linear and Nonlinear Optical Properties of semiconductor Quantum Wells", *Advances in Physics*, Vol. 38, P. 89, 1989. These references teach that the absorption edge in QW material is generally sharper than that in bulk semiconductors with approximately the same bandgap energy and that this difference is preserved over a range of electric fields up to several units of $10^5$ V/cm. With regards to the EAA performance, this means a lower insertion loss and a higher dynamic variable attenuation range in a device with a QW active layer as compared to the device with a bulk active layer. For an embodiment with the layer structure given in Table IIB, at zero bias the electric field in the active layer is about $F\square(3-4)\times 10^4$ V/cm which ensures $\Gamma_\omega(0)A_\omega(0) \leq 0.2$ dB/cm across the entire C-band for either TE- or TM-polarization. The total insertion loss of the integrated EAA with 2-mm long active waveguide portion, which combines contact, coupling and propagation loss, does not exceed 0.6 dB in the C-band. As for the variable attenuation range, the reverse electrical bias of 12 V produces roughly a $3.1\times 10^5$ V/cm strong electric field in the active layer of the embodiment specified in Table IIB, resulting in a material absorption therein of $A_\omega \geq 1.3\times 10^3$ cm$^{-1}$ and a mode attenuation of 20 dB or more over the entire C-band. The range of the input power that enables this dynamic range of variable attenuation is limited by the same nonlinear saturation effects, associated with a photocurrent-induced voltage drop on the sheet resistance of the N-contact layer 7, as was discussed above referring to the embodiment specified in Table IIA. Again, assuming 3-4 side N-contacts of a kind shown in FIG. 3 and requiring that the voltage drop between the contacts does not exceed 1 V, one finds that the optical power at the input of the active waveguide portion is limited to roughly 5 dBm.

Besides the variable attenuation, the embodiment of the invention in the form of an integrated EAA, irrespective of the structure of the device active layer and the mechanism of electroabsorption therein, is also employable for detecting the optical signal propagating within the device. This is a natural feature of the EAA, which attenuates the light due to electric field assisted interband absorption in the device active layer. Electrons and holes generated in this layer are separated by the high electric field resulting in a photocurrent estimated, accordingly to Eqs. (5), as $$J_\omega = \Re_\omega P_{\omega,in} = \frac{e}{\hbar\omega}\int_0^{l_N} dx \cdot \alpha_\omega^{IB}[V(x)]P_\omega(x) = -\frac{w_N}{\rho_N}\frac{dV}{dx}\bigg|_{x=0} > 0. \quad (6)$$

Here, $P_{\omega,in}$ is the input optical power at photon energy $\hbar\omega$ and it is assumed that $x=0$ corresponds to the input of the active waveguide portion. At every given photon energy $\hbar\omega$, the photocurrent is a function of the input optical power $P_{\omega,in}$ and bias voltage applied between the P- and N-contacts of the PIN structure, $V_B$. The functional dependence $J_\omega(P_{\omega,in}, V_B)$ is determined through either direct calibration measurements or simulations or both. The same is applicable to the relative electro-absorptive attenuation, $T_\omega(P_{\omega,in},V_B)$, determined, accordingly to Eqs. (5), as $$T_\omega = P_{\omega,out}/P_{\omega,in} = \exp\left\{-\int_0^{l_N} dx \cdot \alpha_\omega^{IB}[V(x)]\right\}, \quad (7)$$

where $P_{\omega,out}$ is the output optical signal. At a given photon energy $\hbar\omega$ it is also a function of the input optical power $P_{\omega,in}$ and bias voltage $V_B$, which are optionally tabulated by using calibration measurements or/and simulations. Once $J_\omega(P_{\omega,in},V_B)$ and $T_\omega(P_{\omega,in},V_B)$ are known—they are provided, for example, in look-up tables—the EAA is employable as an optical power controller, which combines both optical power monitoring and variable optical attenuating functions. It is worth noting that despite various combinations of attenuating and photodetecting functionalities that have been suggested for device applications in the prior art, none of them have been focused on optical power controlling. So, the device proposed by R. B. Westland et al, in "Dual Function Electro-Absorption Waveguide Modulator/Detector for Optoelectronic Transceiver Applications", *IEEE Photon. Technol. Lett.*, Vol. 8, P. 1540, 1996, operates either as an electroabsorption modulator or a photodetector, but by no means was the photocurrent generated by electroabsorption therein used for driving the modulator. The integrated device proposed by N. Yokouchi et al, in "GaInAsP/InP Attenuator Integrated Waveguide Photodetector (AIPD) Based on the Franz-Keldysh Effect", *10th Intern. Conf. On Indium Phoshide and Related Materials*, 11–15 May 1998, Tsukuba, Japan, and also disclosed by N. Yokouchi et al, in U.S. Pat. No 5,973,339 (October 1999), does have a feedback electric circuit that enables driving the attenuator by analyzing the photocurrent. However, this device has two P-electrodes and two separate active waveguide portions: one for attenuating and one for photodetecting, these portions have different layer structures and are butt-coupled by using a sophisticated multi-step epitaxial growth technique.

Figure 7:
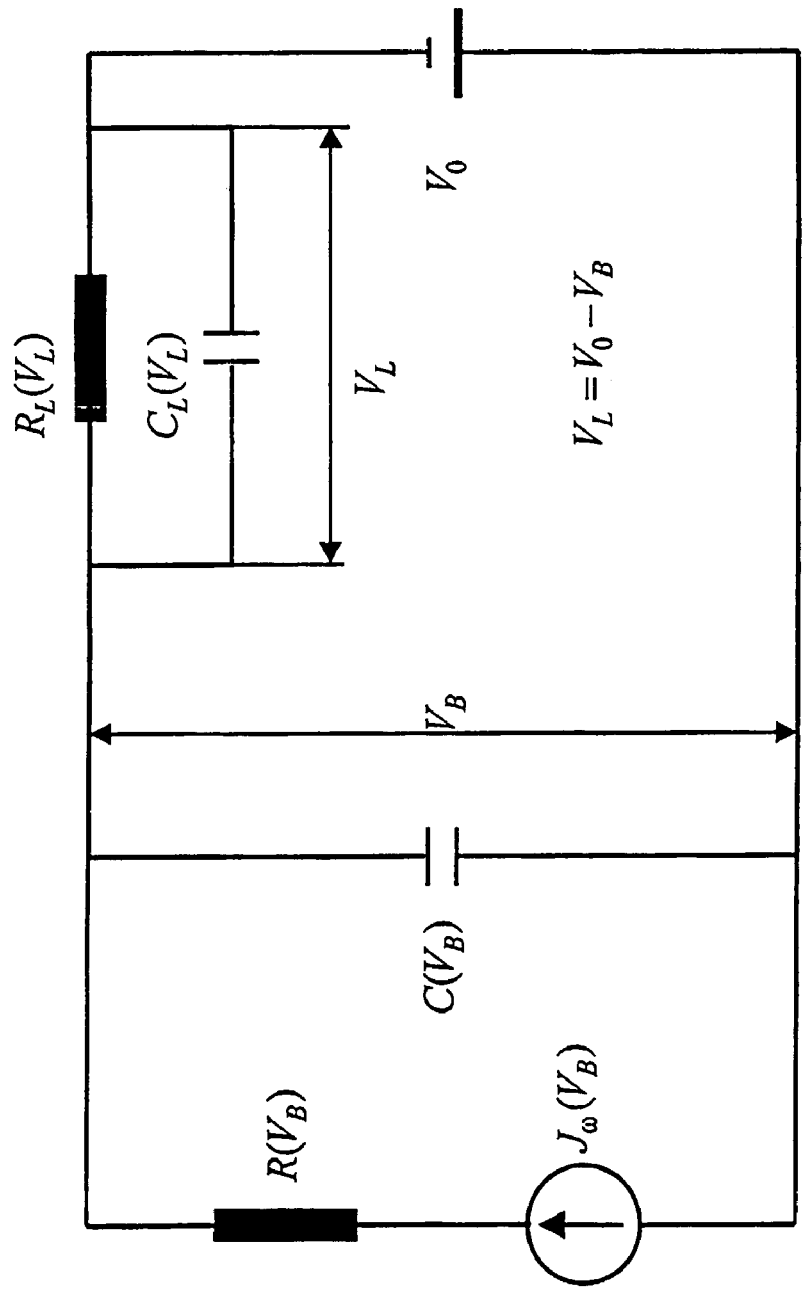
FIG. 7 is a simplified circuit diagram of an integrated EAA connected to a constant voltage supply through a resistive load.

An embodiment in the form of an optical power controller, based on the above-disclosed integrated EAA devices with a layer structure given in either Table IIA or Table IIB, has a single P-electrode for both photodetecting and attenuating functions. The operating principle of the device is explained referring to FIG. 7. This figure is a simplified electric circuit diagram, which represents the EAA as a current source connected to a voltage supply through a resistive load. In circuit schematics, the EAA is described in terms of series resistance $R(V_B)$ and parallel capacitance $C(V_B)$, each of which is a known function of the bias voltage $V_B$. The load is characterized by resistance $R_L(V_L)$ and capacitance $C_L(V_L)$ both, optionally, the functions of the voltage drop across the load, $V_L=V_0-V_B$, where $V_0$ is some predetermined voltage provided by the voltage supply. In fact, the load is optionally another electric circuit, e.g. voltage controller circuit. Under (quasi)-stationary conditions, the load current is equal to the EAA photocurrent, so that by neglecting non-essential dark current, one gets:

$$J_\omega(P_{\omega,in}, V_B) = \frac{V_0 - V_B}{R_L(V_0 - V_B)}. \quad (8)$$

If the current-voltage characteristic of a resistive load is known, this equation determines the unique value of the reverse electric bias $V_B$ that corresponds to a given input optical power $P_{\omega,in}$ at a given photon energy $\hbar\omega$. On the other side, once the photocurrent $J_\omega(P_{\omega,in},V_B)$ and relative electro-absorptive attenuation $T_\omega(P_{\omega,in},V_B)$ are known as functions of the input optical power and bias voltage, Eq. (7) together with Eq. (7), re-written in the form $$T_\omega(P_{\omega,in},V_B)=P_{\omega,out}/P_{\omega,in}, \quad (9)$$

determine these two parameters, $P_{\omega,in}$ and $V_B$, respectively, as functions of the output optical power, $P_{\omega,out}$. This last option provides a way for designing the voltage controller, such that it adjusts the bias voltage $V_B$ for attenuating the signal at the output optical port to an approximately known level, $P_{\omega,out}$, which is less than $P_{\omega,in}$. In this case, the device operates as an optical power controller. A standard method of achieving similar functionality involves, along with variable attenuation, also tapping and monitoring a small fraction of the optical signal to be attenuated. System implementation requires a tap, a monitor and a variable optical attenuator to be integrated in a single component, which, if this is hybrid integration, may be a prohibitively cumbersome and costly solution for some applications. An embodiment described herein is a truly monolithic integration solution that eliminates the need for tapping and the need to set down two separate devices, one for monitoring and one for variable attenuating.

EXAMPLE

Integrated Semiconductor Optical Amplifier

Another exemplary embodiment of the invention, in the form of a monolithically integrated SOA having the layer structure specified in Table III and the device layout illustrated in FIG. 4, is described. The distribution of the vertical mode field in the passive and active waveguide portions is close to that shown in FIG. 6 for the embodiment in the form of the EAA with the layer structure of Table IIB. The layer structure of the integrated SOA is similar to that of the integrated EAA, with the only difference being in the material of the active layer 8. As in the case of the EAA, it is optionally either bulk or QW material, in any event having a bandgap energy close to operating photon energy, $E_g \approx \hbar\omega$. In a particular embodiment with the layer structure given in Table III, the stack of 5 16-nm tensile-strained InGaAs wells and 6 36.6-nm unstrained GaInAsP layers having a bandgap wavelength of 1.0 μm, i.e. the same as that in the quaternary material of the waveguide core 3, is chosen as the material of the active layer. A small amount of tensile strain, resulting in a bandgap of the as-grown active layer of about 1520 nm, is introduced into the wells to equalize the mode gain seen by light in TE- and TM-polarizations. At high injection levels, when the sheet concentration of electrons and holes captured into the wells reaches values providing the required gain, the bandgap wavelength experiences a red shift of some 20–30 nm. towards 1540–1550 nm, due to many body and band-bending effects, e.g. as discussed by V. I. Tolstikhin in "Carrier Charge Imbalance and Optical Properties of Separate Confinement Heterostructure Quantum Well Lasers, *J. Appl. Phys.*, Vol. 87, P. 7342, 2000. Without the strain or if the wells are compressively strained, the modal gain would be higher for TE-polarization than for TM-polarization, both due to higher material gain and a higher confinement factor with the active layer experienced by the TE-mode as compared to the TM-mode. However, a small amount of tensile strain shifts of the gain and refractive index seen by the light in the TM-polarization in a direction that equalizes the two polarizations. Since unstrained GaInAs has a bandgap at 1654 nm and tensile strain shifts it up, the wells should be thick and the amount of strain should be small for operation in the C-band with the wavelength range from about 1530 nm to roughly 1560 nm. There are many other ways for achieving polarization insensitive amplification of the guided waves in InP-based SOAs operating in the C-band, all by tailoring the real and imaginary parts of the permittivity in the active layer by means of band engineering in the semiconductor material of this layer, e.g. as reviewed by P. J. A. Thijs et al, in "Progress in Long-Wavelength Strained-Layer InGaAsP Quantum-Well Semiconductor Lasers and Amplifiers", *IEEE J. Quantum Electron.*, Vol. QE-30, P. 477, 1994.

TABLE III

Possible Layer Structure of InP-Based Monolithically Integrated SOA With a Tensile-Strain Quantum Well Active Layer for Operating in 1.55 μm Communication Window at Room Temperature.

| No | Layer | Material[1] | Doping | Thickness |
|---|---|---|---|---|
| 1 | Substrate | InP | U/D | 350+ μm |
| 2 | Buffer | InP | U/D | 1.0 μm |
| 3 | Core | InGaAsP[$\lambda_g$ = 1.0 μm] | U/D | 0.6 μm |
| 4 | Cladding | InP | U/D | 0.3 μm |
| 5 | Etch stop | InGaAsP[$\lambda_g$ = 1.3 μm] | U/D | 0.005 μm |
| 6 | Cladding | InP | U/D | 0.5 μm |
| 7 | N-contact | InP:S | $5 \times 10^{18}$ cm$^{-3}$ | 0.25 μm |
| 8 | Amplifying | 6 × 36.6 nm InGaAsP (barrier) + 5 × 16 nm TS InGaAs(well), $\lambda_g$ = 1.52 μm [LH1-C1 bandgap] | U/D | 0.3 μm |
| 9 | Spacer | InP | U/D | 0.02 μm |
| 10 | P-contact | InP:Zn | $1 \times 10^{17}$ cm$^{-3}$ | 0.3 μm |
| 11 | P-contact | InP:Zn | $1 \times 10^{18}$ cm$^{-3}$ | 1.5 μm |
| 12 | Cap | InGaAs:Zn | $1 \times 10^{19}$ cm$^{-3}$ | 0.1 μm |

[1] All the layers except well layers in QW stack of amplifying layer are lattice matched to InP substrate. Shown in parenthesis are the wavelengths corresponding to the bandgap in quaternary layers. InGaAs QWs in amplifying layer are slightly tensile strained, InGaAsP barriers are unstrained quaternary layers having the bandgap wavelength of 1.0 μm. Bandgap wavelength of ~1.52 μm in amplifying layer is determined by the upper light hole subband, which is above the upper heavy hole subband due to a tensile strain.

The layout of a monolithically integrated device is shown schematically in FIG. 4. It is substantially different from those of the embodiments in the form of a WPD or an EAA primarily in the geometry of N-contacts. As has been already discussed above, the N-layer 7 of a PIN structure has a limited thickness, due to the principle of the single-mode vertical integration, resulting in a significant sheet resistance of this layer, amounting to $\rho_N \Box 40 \, \Omega$ in the embodiment with the layer structure of Table III. Assuming an injection current density in the range of 1 kA/cm$^2$, an N-layer length of $l_N \Box 1$ mm and a width of $w_N \Box 4$ μm, the injection current to be conducted by the N-layer is estimated to be $J \Box 40$ mA. Should the end N-contacts of the kind shown in FIG. 2 be used for injection, the voltage drop on N-layer 7 would be $\Delta V \Box J \rho_N l_N / w_N \Box 400$ V, which, of course, is absolutely unacceptable. Practically, at forward bias voltages much lower than this value, the Joule power released in the N-layer would heat up the entire device and, therefore, prevent the SOA from reaching amplification conditions even with increasing the injection current. However, if lateral N-contacts, such as those shown in FIG. 4, are employed for injection, the voltage drop of the N-layer will be only $\Delta V \Box J \rho_N w_N / l_N \Box 0.0064$V, i.e. lower by a factor of $(l^N/w_N)^2 \Box 6.25 \times 10^4$ than the end N-contacts. One possible solution featuring lateral N-contacts is schematically shown in FIG. 4. In this design, the active waveguide portion is implemented in the form of a two-step ridge, which comprises the deep and shallow ridges. The bottom part is the deep ridge etched through the waveguide core 3 into the substrate, while the top part is the shallow ridge, etched only up to the N-contact layer 7. The active waveguide portion still supports only one vertical mode in each polarization, but may have more than one lateral mode. However, this two-step ridge active waveguide portion is optionally designed such that the properties of the mode corresponding to the main mode therein are close to those of the single mode in the passive waveguide portion. In one particular embodiment related to FIG. 4, the width of the deep-etched ridge is 8 μm and the width of the shallow-etched ridge is 4 μm, corresponding to a difference between the effective indices of the single mode in the passive waveguide portion and the main mode in the active waveguide portion of less than 0.27% and with an overlap integral between these modes as high as 0.965. Indeed this allows an efficient coupling between the active and passive waveguide portions and also enables forming the lateral N-contacts on the top surface of the deep-etched ridge, which is the upper boundary of the N-contact layer 7.

The operating principle of this embodiment in the form of an integrated SOA is based on providing interband optical gain in the active layer 8, in a spectral range of photon energies close to the bandgap in this layer, $\hbar\omega \square E_g$, by injecting free carriers therein. The amount of gain is related to the level of inversion in carrier population within the active layer 8, which is pre-determined by the concentration of electrons and holes in the active (sub)bands therein. The last is controlled through modulation of the injection current, achieved by variable forward biasing of the PIN structure at the top of the active waveguide portion. Once the optical signal propagates within the active waveguide portion having a controllable gain feature as described above, it is variably amplified. The mechanisms of both optical gain and amplification are not any different from those in standard InP-based SOAs, e.g. such as those reviewed by J. C. Simon in "GaInAsP Semiconductor Laser Amplifiers for Single-Mode Fiber Communications", *IEEE J. Lightwave Technol.*, Vol. LT-5, P. 1286, 1987. The integrated SOA operates as a current-controlled device, the important characteristics being the injection current and amplification range. For the embodiment with the layer structure of Table III, the sheet concentration of the electron-hole plasma in each of the quantum wells in the active layer 8 of about $4 \times 10^{12}$ cm$^{-2}$ will be sufficient for providing optical gain in this layer exceeding $9.2 \times 10^2$ cm$^{-1}$ for all wavelengths within the C-band. Given that the confinement factor of either the TE- or TM-mode with the active layer under such conditions is estimated as ~1.5%, this means that the integrated SOA with a 2-mm long active waveguide portion will show a gain of at least 12 dB across the entire C-band. This is more than enough for many applications requiring on-chip optical gain as a means for compensating insertion loss and enabling loss-free WDM components. However, on-chip optical amplification comes with a price, which is a high injection current and related heating of the device. While an accurate estimate of the injection current that would result in a pre-determined amount of optical gain is very difficult to make, taking into account the realities of capture-escape and recombination dynamics in the active layer along with the lattice and carrier heating effects therein, a rough estimate and published experimental data, e.g. those reported by P. J. A. Thijs et al in "Progress in Long-Wavelength Strained-Layer InGaAsP Quantum-Well Semiconductor Lasers and Amplifiers", *IEEE J. Quantum Electron.*, Vol. QE-30, P. 477, 1994, both suggest that in the example above, we are looking at injection currents in the range of ~100 mA.

What is claimed is:

1. A monolithically integrated semiconductor waveguide device with active and passive semiconductor waveguide portions comprising:

a passive waveguide portion for single-mode guiding of light propagating therein, and an active waveguide portion provided by disposing additional layers which form a PIN structure on top of the passive waveguide portion, the active waveguide portion having waveguide properties substantially similar to those of the passive waveguide portion with the exception of a mode tail above a top surface of the passive waveguide portion within the active waveguide portion, such that, in use, an optical signal propagating within the active waveguide portion penetrates an I-layer of the PIN structure and interacts with semiconductor material therein for actively affecting an intensity of the optical signal with no substantial changes in guiding properties of the semiconductor waveguide wherein, the active portion and the passive portion are single mode ridge waveguides such that a P-contact to the PIN structure is disposed on a top surface in the active portion and an N-contact to the PIN structure is disposed on the top surface of the passive portion, at one or both ends of the active portion.

2. A monolithically integrated semiconductor waveguide device with active and passive semiconductor waveguide portions comprising:

a passive waveguide portion for single-mode guiding of light propagating therein, and an active waveguide portion provided by disposing additional layers which form a PIN structure on top of the passive waveguide portion, the active waveguide portion having waveguide properties substantially similar to those of the passive waveguide portion with the exception of a mode tail above a top surface of the passive waveguide portion within the active waveguide portion, such that, in use, an optical signal propagating within the active waveguide portion penetrates an I-layer of the PIN structure and interacts with semiconductor material therein for actively affecting an intensity of the optical signal with no substantial changes in guiding properties of the semiconductor waveguide wherein the active portion and the passive portion are single mode ridge waveguides so that a P-contact to the PIN structure is disposed on a top surface in the active portion and an N-contact to the PIN structure is disposed on a top surface of one or more side ridge, the side ridge having the same layer structure as the passive waveguide portion and forming T-junctions with the active waveguide portion.

3. A monolithically integrated waveguide device with active and passive semiconductor waveguide portions comprising:

a passive waveguide portion for single-mode guiding of light propagating therein, and an active waveguide portion provided by disposing additional layers which form a PIN structure on top of the passive waveguide portion, the active waveguide portion having waveguide properties substantially similar to those of the passive waveguide portion with the exception of a mode tail above a top surface of the passive waveguide portion within the active waveguide portion, such that, in use, an optical signal propagating within the active waveguide portion penetrates an I-layer of the PIN structure and interacts with semiconductor material therein for actively affecting an intensity of the optical signal with no substantial changes in guiding properties of the semiconductor waveguide wherein, the active portion is a two-step ridge waveguide, a first step forming a lower part of the two-step ridge waveguide is a wide ridge etched through the waveguide core and a second step forming an upper part is a narrow ridge, more narrow than the lower part, etched only up to the top surface of the passive waveguide portion, so that a P-contact to the PIN structure is disposed on the top surface of the narrower shallow-etched part of the two-step ridge and an N-contact to the PIN structure is disposed in as metal strips on both sides of the narrow ridge.

4. A monolithically integrated waveguide device according to claim 1, wherein, the active waveguide portion is an InP-based epitaxial structure comprising the PIN structure at the top of the waveguide such that an I-layer of this PIN structure is an active layer designed for having a bandgap energy below the bandgap energy of any other layer and related to an operation photon energy in a certain predetermined way and, said bandgap energy of the active layer is below the operation photon energy so that the active layer absorbs light propagating therein due to direct interband optical transitions, wherein, in use, the active portion acts as a waveguide photodetector.

5. A monolithically integrated waveguide device according to claim 1, wherein, the active waveguide portion is an InP-based epitaxial structure comprising the PIN structure at the top of the waveguide such that an I-layer of this PIN structure is an active layer designed for having a bandgap energy below the bandgap energy of any other layer and related to an operation photon energy in a certain predetermined way and, said bandgap energy of the active layer is slightly above the operation photon energy so that the active layer absorbs light propagating therein due to electric field assistant interband optical transitions, wherein, in use, the active portion acts as an electro-absorptive attenuator.

6. A monolithically integrated waveguide device with active and passive semiconductor waveguide portions according to claim 5 wherein, the active layer is a bulk semiconductor material and, in use, the absorption of light within the active layer is field-assistant interband absorption below the bandgap caused by Franz-Keldysh effect.

7. A monolithically integrated waveguide device with active and passive semiconductor waveguide portions according to claim 5 wherein, the active layer is a quantum-well semiconductor material and, in use, the absorption of light in the active layer is field-assistant interband absorption below the bandgap caused by quantum-confined Stark effect.

8. A monolithically integrated waveguide device with active and passive semiconductor waveguide portions according to claim 7 wherein, the quantum well layers are tensile strained by a predetermined amount for enhancing absorption in TM-polarization as compared to absorption in TE-polarization and reducing a difference between TM- and TE-modes in their confinement factor with the active layer such that, in use, polarization sensitivity of the field assistant interband absorption below the bandgap is reduced.

9. A monolithically integrated waveguide device according to claim 2, wherein, the active layer is a bulk semiconductor material and, in use, the absorption of light within the active layer is field-assistant interband absorption below the bandgap caused by Franz-Keldysh effect and, this active portion acts as an electro-absorptive variable optical attenuator having transmission controlled through modulating the interband absorption in the bulk active layer by reverse electric biasing of the PIN structure.

10. A monolithically integrated waveguide device according to claim 2, wherein, the active layer is a quantum-well semiconductor material and, in use, the absorption of light in the active layer is field-assistant interband absorption below the bandgap caused by quantum-confined Stark effect and, this active portion acts as an electro-absorptive variable optical attenuator having transmission controlled through modulating the interband absorption in the quantum-well active layer by reverse electric biasing of the PIN structure.

11. A monolithically integrated waveguide device according to claim 10 in the form of an electro-absorptive variable optical attenuator wherein, the quantum-well layers are tensile strained by a predetermined amount for reducing polarization sensitivity of said electro-absorptive variable optical attenuator.

12. A monolithically integrated waveguide device with active and passive semiconductor waveguide portions according to claim 6 wherein, in use, a photocurrent generated by an electric field induced interband absorption in the active layer is used for detecting light propagating within the active portion.

13. A monolithically integrated waveguide device with active and passive semiconductor waveguide portions according to claim 7 wherein, in use, a photocurrent generated by an electric field induced interband absorption in the active layer is used for detecting light propagating within the active portion.

14. A monolithically integrated waveguide device with active and passive semiconductor waveguide portions according to claim 12 wherein, in use, the electric field-assistant interband absorption is caused by the Franz-Keldysh effect.

15. A monolithically integrated waveguide device with active and passive semiconductor waveguide portions according to claim 13 wherein, the active layer is the quantum-well semiconductor material and, in use, the electric field-assistant interband absorption is caused by the quantum confined Stark effect.

16. A monolithically integrated waveguide device according to claim 9 having an InP-based epitaxial structure of an active waveguide portion wherein, in use, a photocurrent generated by an electric field induced interband absorption in the active layer is used for detecting light propagating within the active portion and, the active portion acts as an electro-absorptive variable optical attenuator, additionally comprising a monitor signal port for providing an electrical signal in dependence upon a monitored intensity of light propagating within this active portion.

17. A monolithically integrated waveguide device according to claim 9 having an InP-based epitaxial structure of an active waveguide portion additionally comprising a monitor signal port for providing an electrical signal in dependence upon a monitored intensity of guided light propagating within this active portion wherein, in use, a photocurrent generated by an electric field induced interband absorption in the bulk active layer is used for detecting light propagating within the active portion, said electric field-assistant interband absorption is caused by the Franz-Keldysh effect and, the active portion acts as an electro-absorptive variable optical attenuator.

18. A monolithically integrated waveguide device according to claim 10 having an InP-based epitaxial structure of an active waveguide portion additionally comprising a monitor signal port for providing an electrical signal in dependence upon a monitored intensity of guided light propagating within this active portion wherein, in use, a photocurrent generated by an electric field induced interband absorption in the quantum-well active layer is used for detecting light propagating within the active portion, said electric field-assistant interband absorption is caused by the quantum-confined Stark effect and, the active portion acts as an electro-absorptive variable optical attenuator.

19. A monolithically integrated waveguide device according to claim 14 additionally comprising a controller for providing an electrical control signal for varying a voltage across the electro-absorptive attenuator wherein, in use, the active waveguide variably attenuates light in dependence upon the electrical signal at the monitor signal port, such that an intensity of an optical signal at an output port of the active portion is adjustable to a predetermined intensity.

20. A monolithically integrated waveguide device according to claim 15 additionally comprising a controller for providing an electrical control signal for varying a voltage across the electro-absorptive attenuator wherein, in use, the active waveguide variably attenuates light in dependence upon the electrical signal at the monitor signal port, such that an intensity of an optical signal at an output port of the active portion is adjustable to a predetermined intensity.

21. A monolithically integrated waveguide device according to claim 19 wherein the controller comprises a voltage control circuit for receiving a feedback signal in response to a photocurrent-induced voltage drop on a resistive load connected in series with the electro-absorptive attenuator to a voltage supply and, in use, varying a load resistance in dependence upon the feedback signal in order to maintain the electro-absorptive attenuator bias and hence, provide an appropriately attenuated optical path such that an output optical signal is approximately within a predetermined intensity range.

22. A monolithically integrated waveguide device according to claim 20 wherein the controller comprises a voltage control circuit for receiving a feedback signal in response to a photocurrent-induced voltage drop on a resistive load connected in series with the electro-absorptive attenuator to a voltage supply and, in use, varying a load resistance in dependence upon the feedback signal in order to maintain the electro-absorptive attenuator bias and hence, provide an appropriately attenuated optical path such that an output optical signal is approximately within a predetermined intensity range.

23. A monolithically integrated waveguide device according to claim 3, wherein, the active waveguide portion is an InP-based epitaxial structure comprising the PIN structure at the top of the waveguide such that an I-layer of this PIN structure is an active layer designed for having a bandgap energy below the bandgap energy of any other layer and related to an operation photon energy in a certain predetermined way and, said bandgap energy of the active layer is close to the operation photon energy so that under the carrier injection conditions the active layer amplifies light propagating therein due to stimulated direct interband optical transitions, wherein, in use, the active portion acts as a semiconductor optical amplifier.

24. A monolithically integrated waveguide device with active and passive semiconductor waveguide portions according to claim 23, wherein, the active layer is a bulk semiconductor material.

25. A monolithically integrated waveguide device with active and passive semiconductor waveguide portions according to claim 23, wherein, the active layer is a quantum-well semiconductor material.

26. A monolithically integrated waveguide device with active and passive semiconductor waveguide portions according to claim 25 wherein, the quantum well layers are tensile strained by a predetermined amount for enhancing the optical gain in TM-polarization as compared to the optical gain in TE-polarization and reducing a difference between TM- and TE-modes in their confinement factor with the active layer such that, in use, polarization sensitivity of the integrated semiconductor optical amplifier is reduced.

27. A monolithically integrated waveguide device with active and passive semiconductor waveguide portions according to claim 24, wherein, the active layer is a bulk semiconductor material and, in use, the active portion acts as a semiconductor optical amplifier having transmission controlled through modulating the optical gain in the bulk active layer by forward electric biasing of the PIN structure.

28. A monolithically integrated waveguide device with active and passive semiconductor waveguide portions according to claim 25, wherein, the active layer is a quantum-well semiconductor material and, in use, the active portion acts as a semiconductor optical amplifier having transmission controlled through modulating the optical gain in the quantum-well active layer by forward electric biasing of the PIN structure.

29. A monolithically integrated waveguide device according to claim 4 additionally comprising an InP-based planar demultiplexer with an input port for receiving a wavelength multiplexed optical signal and providing a plurality of output optical signals, each output signal corresponding to a predetermined wavelength channel, said demultiplexer integrated on a same substrate as said monolithically integrated waveguide device, said monolithically integrated waveguide device optically coupled to said demultiplexer for receiving one of said output signals and, in use, monitoring the intensity of light incident thereon.

30. A monolithically integrated waveguide device according to claim 5 additionally comprising an InP-based planar demultiplexer with an input port for receiving a wavelength multiplexed optical signal and providing a plurality of output optical signals, each output signal corresponding to a predetermined wavelength channel, said demultiplexer integrated on a same substrate as said monolithically integrated waveguide device, said monolithically integrated waveguide device optically coupled to said demultiplexer for transmitting one of said output signals and, in use, variably attenuating the intensity of light incident thereon.

31. A monolithically integrated waveguide device according to claim 12 additionally comprising an InP-based planar demultiplexer with an input port for receiving a wavelength multiplexed optical signal and providing a plurality of output optical signals, each output signal corresponding to a predetermined wavelength channel, said demultiplexer integrated on a same substrate as said monolithically integrated waveguide device, said monolithically integrated waveguide device optically coupled to said demultiplexer for detecting and transmitting one of said output signals and, in use, simultaneously monitoring and variably attenuating the intensity of light incident thereon.

32. A monolithically integrated waveguide device according to claim 23 additionally comprising an InP-based planar demultiplexer with an input port for receiving a wavelength multiplexed optical signal and providing a plurality of output optical signals, each output signal corresponding to a predetermined wavelength channel, said demultiplexer integrated on a same substrate as said monolithically integrated waveguide device, said monolithically integrated waveguide device optically coupled to said demultiplexer for transmitting one of said output signals and, in use, variably amplifying the intensity of light incident thereon.

33. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein, a difference between the first mode profile and the second mode profile is very small but other than negligible, the difference between the first mode profile and the second mode profile is confined to within tail portions of the mode profiles for the first and second optical modes and the difference between the first mode profile and the second mode profile is confined to one and only one of a TE mode profile or a TM mode profile.

34. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein, a difference between the first mode profile and the second mode profile is very small but other than negligible, the difference between the first mode profile and the second mode profile is confined to within tail portions of the mode profiles for the first and second optical modes and the difference between the first mode profile and the second mode profile is symmetric between each of a TE mode profile or a TM mode profile.

35. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein the passive waveguide portion is a waveguide portion having low birefringence.

36. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein the passive waveguide portion is a waveguide portion having low loss.

37. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein the active portion is an electro-absorptive element responsive to an electrical control signal for varying an amount of electro-absorption within the active portion of the integrated device for attenuating light propagating within the integrated waveguide.

38. An integrated waveguide according to claim 37 wherein the active portion is an electro-absorptive component for monitoring light propagating within the integrated waveguide and wherein the active portion comprises a monitor signal port for providing an electrical signal in dependence upon a monitored intensity of light propagating within the integrated waveguide.

39. An integrated waveguide according to claim 38 comprising:

a controller for providing the electrical control signal for varying a voltage across the electro-absorptive element in dependence upon the electrical signal at the monitor signal port, wherein an optical signal at an output of the integrated waveguide is adjustable to approximately a known level.

40. An integrated waveguide comprising:

a passive waveguide portion for single-mode guiding of light propagating therein and having a top surface, and an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon, such that a difference between the first mode profile and the second mode profile is sufficient for substantially affecting an optical signal propagating within the integrated waveguide wherein the active portion is an amplifying element for amplifying light propagating within the integrated waveguide.

41. An integrated waveguide comprising:
a passive waveguide portion for single-mode guiding of light propagating therein and having a top surface, and
an active portion disposed on the top surface for actively affecting in the active portion an intensity of light propagating within the integrated waveguide, wherein the integrated waveguide including the active portion has an optical mode having a first mode profile similar but different to a second mode profile of an optical mode of the passive waveguide portion absent the active portion disposed thereon,
such that a difference between the first mode profile and the second mode profile is sufficient for substantially affecting an optical signal propagating within the integrated waveguide wherein the active portion is an electro-absorptive element for selectively amplifying and attenuating of light propagating within the integrated waveguide in response to an electrical control signal.

42. An integrated waveguide according to claim 41 comprising:
a controller for providing the electrical control signal for varying a voltage across the electro-absorptive element, wherein an optical signal at an output of the integrated waveguide is adjustable to approximately a known level.

43. A method of affecting an optical signal within an integrated waveguide comprising:
providing a passive optical waveguide having a top surface and for guiding light with a single mode and having a first mode profile;
providing an active layer disposed on the top surface of the passive optical wave guide thereby producing an active portion, the active portion having a second mode profile similar to the first mode profile about a central portion of the mode profile but differing substantially from the first mode profile in at least a region of the mode profiles other than the central portion;
providing an optical signal propagating within the waveguide; and,
actively affecting an intensity of the propagating optical signal by affecting that portion of the propagating light corresponding to the portion of the second mode profile that differs substantially wherein actively affecting comprises attenuating.

44. A method of affecting an optical signal within an integrated waveguide comprising:
providing a passive optical waveguide having a top surface and for guiding light with a single mode and having a first mode profile;
providing an active layer disposed on the top surface of the passive optical wave guide thereby producing an active portion, the active portion having a second mode profile similar to the first mode profile about a central portion of the mode profile but differing substantially from the first mode profile in at least a region of the mode profiles other than the central portion;
providing an optical signal propagating within the waveguide;
actively affecting an intensity of the propagating optical signal by affecting that portion of the propagating light corresponding to the portion of the second mode profile that differs substantially; and, detecting and variably attenuating light propagating within a same active portion of the waveguide.

45. A method of affecting an optical signal within an integrated waveguide comprising:
providing a passive optical waveguide having a top surface and for guiding light with a single mode and having a first mode profile;
providing an active layer disposed on the top surface of the passive optical waveguide thereby producing an active portion, the active portion having a second mode profile similar to the first mode profile about a central portion of the mode profile but differing substantially from the first mode profile in at least a region of the mode profiles other than the central portion;
providing an optical signal propagating within the waveguide; and,
actively affecting an intensity of the propagating optical signal by affecting that portion of the propagating light corresponding to the portion of the second mode profile that differs substantially wherein actively affecting comprises amplifying.

* * * * *